(12) United States Patent
Huang et al.

(10) Patent No.: US 11,646,364 B2
(45) Date of Patent: May 9, 2023

(54) POWER DEVICE HAVING LATERAL INSULATED GATE BIPOLAR TRANSISTOR (LIGBT) AND MANUFACTURING METHOD THEREOF

(71) Applicant: RICHTEK TECHNOLOGY CORPORATION, Zhubei (TW)

(72) Inventors: Chih-Feng Huang, Hsinchu (TW); Lung-Sheng Lin, Taichung (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 259 days.

(21) Appl. No.: 17/187,540

(22) Filed: Feb. 26, 2021

(65) Prior Publication Data

US 2021/0305414 A1 Sep. 30, 2021

Related U.S. Application Data

(60) Provisional application No. 62/994,348, filed on Mar. 25, 2020.

(30) Foreign Application Priority Data

Jun. 5, 2020 (TW) .................................. 109118930

(51) Int. Cl.
*H01L 29/739* (2006.01)
*H01L 29/66* (2006.01)
*H01L 27/07* (2006.01)
*H01L 27/02* (2006.01)

(52) U.S. Cl.
CPC ...... *H01L 29/7393* (2013.01); *H01L 27/0248* (2013.01); *H01L 27/0783* (2013.01); *H01L 29/66325* (2013.01)

(58) Field of Classification Search
CPC .............. H01L 29/7393–7398; H01L 27/0248
See application file for complete search history.

(56) References Cited

U.S. PATENT DOCUMENTS

| 8,164,162 | B2 | 4/2012 | Hsieh | |
|---|---|---|---|---|
| 2010/0302693 | A1* | 12/2010 | Hayashi | .............. H01L 29/7393 361/56 |
| 2010/0314681 | A1* | 12/2010 | Hsieh | ................ H01L 29/41766 257/334 |
| 2021/0211125 | A1* | 7/2021 | Summerland | ....... H01L 27/0783 |

* cited by examiner

*Primary Examiner* — Matthew C Landau
*Assistant Examiner* — Mark Hatzilambrou
(74) *Attorney, Agent, or Firm* — Tung & Associates

(57) ABSTRACT

A power device which is formed on a semiconductor substrate includes: a lateral insulated gate bipolar transistor (LIGBT), a PN diode and a clamp diode. The PN diode is connected in parallel to the LIGBT. The clamp diode has a clamp forward terminal and a clamp reverse terminal, which are electrically connected to a drain and a gate of the LIGBT, to clamp a gate voltage applied to the gate not to be higher than a predetermined voltage threshold.

18 Claims, 19 Drawing Sheets

POWER DEVICE HAVING LATERAL INSULATED GATE BIPOLAR TRANSISTOR (LIGBT) AND MANUFACTURING METHOD THEREOF

CROSS REFERENCE

The present invention claims priority to U.S. 62/994,348 filed on Mar. 25, 2020 and claims priority to TW 109118930 filed on Jun. 5, 2020.

BACKGROUND OF THE INVENTION

Field of Invention

The present invention relates to a power device; particularly, it relates to such power device including a lateral insulated gate bipolar transistors (LIGBT). The present invention also relates to a manufacturing method of such a power device.

Description of Related Art

Please refer to FIGS. 1A and 1B, which show a top view and a cross-section view of a conventional power device (i.e., power device 100) including a lateral insulated gate bipolar transistors (LIGBT), respectively. The power device 100 is configured to operably control a flywheel current of a flywheel motor; the flywheel current flows through the power device 100 to drive the flywheel motor. The flywheel motor controls a flywheel to store kinetic energy during rotation of the flywheel, which is well known to those skilled in the art, so the details thereof are not redundantly explained here. Generally, the power device 100 includes plural LIGBTs which are connected in parallel to each other and a PN diode. (However, in FIGS. 1A and 1B, only one LIGBT (LIGBT1) is illustrated as an example).

As shown in FIGS. 1A and 1B, the power device 100 is formed on a semiconductor substrate 11, and the power device 100 comprises an LIGBT (LIGBT1) and a PN diode PN1. FIG. 1B is a cross sectional view of the power device 100 taken along A-A' line of FIG. 1A. The PN diode PN1 includes: a first field oxide region 121, a first N-type region 131, a first N-type extension region 141, a first P-type well 151, a gate 161, a reverse terminal 171 and a forward terminal 181. The first N-type region 131, the first N-type extension region 141, the first P-type well 151, the reverse terminal 171 and the forward terminal 181 are formed in an epitaxial layer on a first insulation bottom layer 12. A first insulation structure ISO1 includes the first insulation bottom layer 12 and a first insulation side wall 123. The first insulation bottom layer 12 is formed on the semiconductor substrate 11 and in contact with the semiconductor substrate 11. The first insulation structure ISO1 is located beneath an upper surface of the epitaxial layer and encompasses the PN diode PN1 in a closed manner, so that the PN diode PN1 can be electrically insulated from other devices under the upper surface of the epitaxial layer.

The LIGBT (LIGBT1) is formed on the semiconductor substrate 11. As shown in FIGS. 1A and 1B, the LIGBT (LIGBT1) includes: a second field oxide region 122, a second N-type region 132, a second N-type extension region 142, a second P-type well 152, a gate 162, a drain 172, an emitter 182 and a P-type contact 184. The second N-type region 132, the second N-type extension region 142, the second P-type well 152, the drain 172, the emitter 182 and the P-type contact 184 are formed in the epitaxial layer on a second insulation bottom layer 12'. A second insulation structure ISO2 includes the second insulation bottom layer 12' and a second insulation side wall 124. The second insulation structure ISO2 is located beneath the upper surface of the epitaxial layer and encompasses the LIGBT (LIGBT1) in a closed manner, so that the LIGBT (LIGBT1) can be electrically insulated from other devices under the upper surface of the epitaxial layer. As shown in FIG. 1A, a third insulation side wall 125 forms a closed surrounding side wall, which encloses the first insulation side wall 123 and the second insulation side wall 124 within the third insulation side wall 125. That is, the power device 100 is encompassed by the closed surrounding side wall formed by the third insulation side wall 125.

Please refer to FIGS. 1C and 1D, which show schematic diagrams illustrating the power device 100 by circuit symbols and electrical characteristic curves of the power device 100, respectively. Referring to the circuit symbols illustrated with thick black solid lines in FIG. 1B, along with FIGS. 1C and 1D, the LIGBT (LIGBT1) operates as thus: the gate 162 (i.e., gate G) to control a base current of a bipolar junction transistor (BJT) formed by the emitter 182 (i.e., emitter E), the second N-type extension region 142 and the second P-type well 152, so as to turn ON the LIGBT (LIGBT1). Through arranging different base widths and concentrations, the amplification ratio of the conduction current IC can be determined, whereby an optimal conduction voltage can be set to reduce power consumption. The base current of the LIGBT (LIGBT1) is controlled by the gate voltage (i.e., a voltage which is applied onto the gate 162); the base current and the emitter current will increase in proportional to the increase of the gate voltage.

When the LIGBT (LIGBT1) is adopted to drive a motor, it is required for the LIGBT (LIGBT1) to pass a short circuit test. In a typical short circuit test, a voltage which is applied onto the gate 162 (i.e., gate G) of the LIGBT (LIGBT1) is increased to a maximum supply voltage (which usually ranges between 15V to 20V), and a voltage which is applied onto the emitter 182 (i.e., emitter E) of the LIGBT (LIGBT1) is increased to a bulk voltage (which is for example but not limited to 400V). Under such situation, the conduction current IC flowing through the drain 172 (i.e., drain C) will reach a maximum level. When such conduction current IC having a maximum level flows through a resistor Re, in the LIGBT (LIGBT1), it can easily turn ON the parasitic NPNBJT formed by the second N-type region 132, the second P-type well 152 and the drain 172, triggering a PNPN latch-up effect in the parasitic NPNBJT and damage the power device 100. Higher conduction current IC increases the likelihood of such damage. Therefore, it is required to properly limit the maximum level of the conduction current IC, to reduce the likelihood of triggering of the unwanted PNPN latch-up effect.

The conventional method for limiting the conduction current IC is by controlling the base current, that is, by controlling the voltage applied onto the gate 162 not to have a drastic voltage change. To achieve this, the conventional method provides an additional voltage regulator circuit in the gate driving circuit to suppress the abnormally high voltage that may be applied onto the gate. Such conventional method may be able to effectively control the issue caused by an unstable voltage supply, but, when it comes to a case where an external short circuit causes a sensing voltage across a gate-emitter capacitor Cge to be too huge, such conventional method will be ineffective. As shown in FIG. 1C, under a case where a short circuit test is carried out from outside, when a high voltage of another phase contacts the phase to be tested, the voltage applied onto the emitter 182 will be elevated up to generate a surge (as shown by the signal waveform illustrated at the right side of the emitter E in FIG. 1C), and a voltage applied onto the gate G (as shown by the signal waveform illustrated at the bottom side of the gate G in FIG. 1C) will correspondingly be elevated up by the coupling effect of the gate-emitter capacitor Cge. As a result, the base current and the conduction current IC will be increased drastically, thus greatly enhancing the likelihood of triggering the unwanted PNPN latch-up effect.

In view of above, to overcome the drawback in the prior art, the present invention provides a power device including a lateral insulated gate bipolar transistor (LIGBT) and a manufacturing method of such a power device, which is capable of reducing the likelihood of triggering the PNPN latch-up effect.

SUMMARY OF THE INVENTION

From one perspective, the present invention provides a power device, which is formed on a semiconductor substrate and which is configured to operably drive a motor; the power device comprising: a lateral insulated gate bipolar transistors (LIGBT); a PN diode, which is connected in parallel to the LIGBT; and a clamp diode having a clamp forward terminal and a clamp reverse terminal, which are electrically connected to a drain and a gate of the LIGBT, respectively, to clamp a gate voltage applied to the gate not to be higher than a predetermined voltage threshold.

From another perspective, the present invention provides a manufacturing method of a power device, wherein the power device is formed on a semiconductor substrate and is configured to operably drive a motor; the manufacturing method comprising: forming a lateral insulated gate bipolar transistors (LIGBT); forming a PN diode, which is connected in parallel to the LIGBT; and forming a clamp diode, wherein the clamp diode has a clamp forward terminal and a clamp reverse terminal, which are electrically connected to a drain and a gate of the LIGBT, respectively, to clamp a gate voltage applied to the gate not to be higher than a predetermined voltage threshold.

In one embodiment, the PN diode includes: a first N-type region, which is formed in an epitaxial layer of the semiconductor substrate; a first P-type well, which is formed in the first N-type region; a first N-type extension region, which is formed in the first N-type region, wherein the first N-type extension region and the first P-type well are separated from each other by the first N-type region; a first reverse terminal having N conductivity type, wherein the first reverse terminal is formed in the first N-type extension region, wherein the first reverse terminal is configured to serve as an electric contact of the first N-type extension region; and a first forward terminal having P conductivity type, wherein the first forward terminal is formed in the first P-type well, wherein the first forward terminal is configured to serve as an electric contact of the first P-type well.

In one embodiment, the LIGBT includes: a second N-type region, which is formed in the epitaxial layer of the semiconductor substrate; a second P-type well, which is formed in the second N-type region; the drain, which has N conductivity type, and is formed in the second P-type well; a P-type contact, which is formed in the second P-type well, wherein the P-type contact is configured to serve as an electric contact of the second P-type well; the gate, which is formed on the epitaxial layer, wherein a part of the gate is connected on the second P-type well; a second N-type extension region, which is formed in the second N-type region, wherein the second N-type extension region and the second P-type well are separated from each other by the second N-type region; and an emitter having P conductivity type, which is formed in the second N-type extension region.

In one embodiment, the clamp diode is a Zener diode, which includes: a third P-type well, which is formed in the epitaxial layer of the semiconductor substrate; a second forward terminal having P conductivity type, wherein the second forward terminal is formed in the third P-type well, wherein the second forward terminal is configured to serve as the clamp forward terminal and an electric contact of the third P-type well; a third N-type extension region, which is formed in the third P-type well; and a second reverse terminal having N conductivity type, wherein the second reverse terminal is formed in the third N-type extension region, wherein the second reverse terminal is configured to serve as the clamp reverse terminal and an electric contact of the third N-type extension region.

In one embodiment, the Zener diode further includes: an N-type adjustment region, which is formed beneath and in contact with an upper surface of the epitaxial layer, wherein the N-type adjustment region beneath the upper surface lies between the third P-type well and the third N-type extension region, to serve for adjusting a forward voltage of a PN junction formed between the third P-type well and the third N-type extension region.

In one embodiment, the Zener diode further includes: a P-type adjustment region, which is formed beneath and in contact with an upper surface of the epitaxial layer, wherein the P-type adjustment region beneath the upper surface lies between the third P-type well and the third N-type extension region, to serve for adjusting a forward voltage of a PN junction formed between the third P-type well and the third N-type extension region.

In one embodiment, the Zener diode further includes: an electrostatic discharge (ESD) protection region having N conductivity type, which is formed beneath and in contact with the upper surface of the epitaxial layer, wherein the ESD protection region beneath the upper surface lies between the third N-type extension region and the second forward terminal, wherein the ESD protection region, the third P-type well and the third N-type extension region together form an NPN transistor, wherein the ESD protection region is electrically connected to the second forward terminal.

In one embodiment, the first N-type extension region, the second N-type extension region and the third N-type extension region are formed simultaneously by a same lithography process step and a same ion implantation process step; the first P-type well and the second P-type well are formed simultaneously by a same lithography process step and a same ion implantation process step; the first reverse terminal, the drain and the second reverse terminal are formed simultaneously by a same lithography process step and a same ion implantation process step; and the first forward terminal, the emitter, the P-type contact and the second forward terminal are formed simultaneously by a same lithography process step and a same ion implantation process step.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations among the process steps and the layers, while the shapes, thicknesses, and widths are not drawn in actual scale.

Figure 1A:
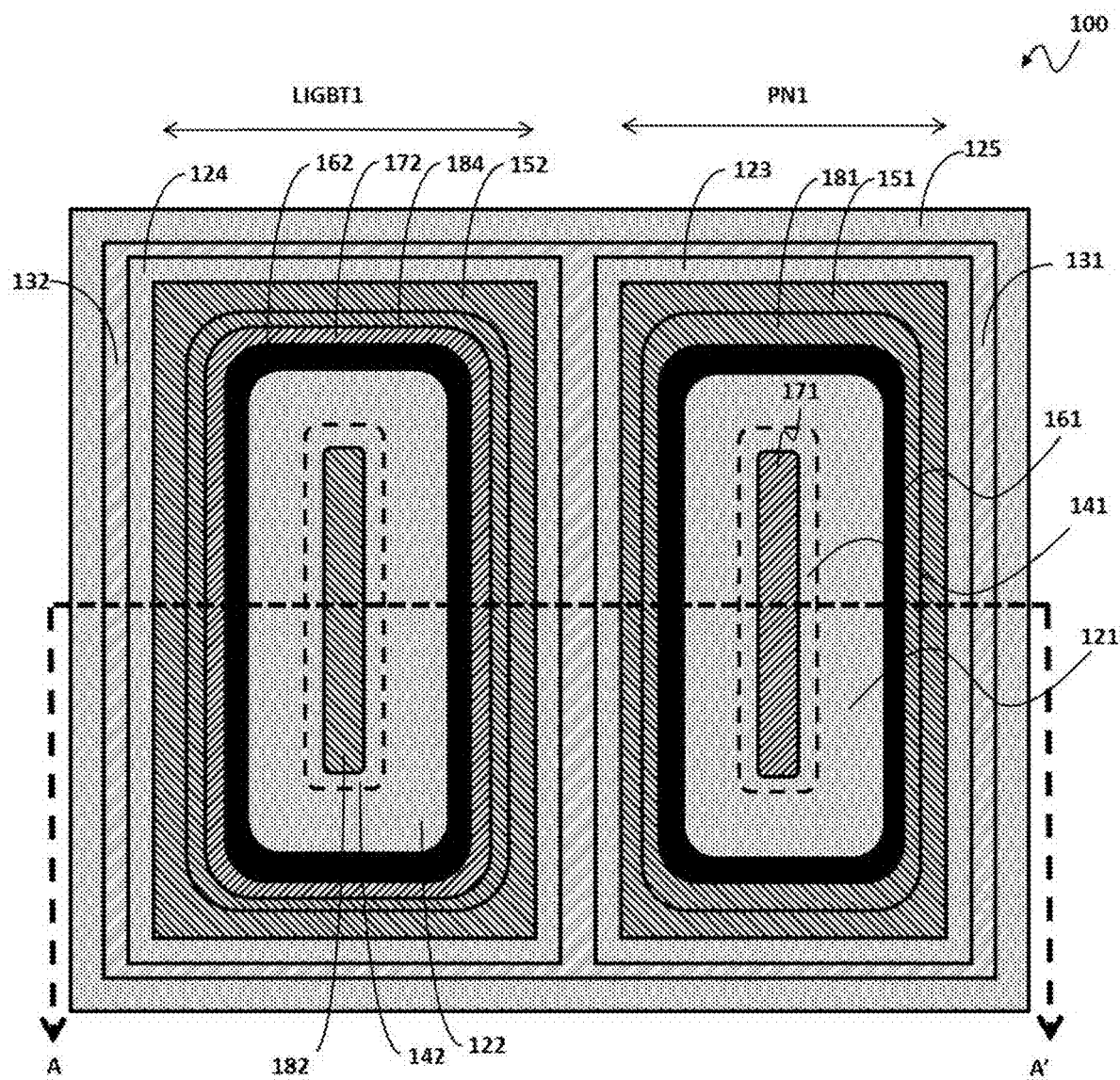
FIGS. 1A and 1B show a top view and a cross-section view of a conventional power device (i.e., power device 100) including a lateral insulated gate bipolar transistor (LIGBT), respectively.
Figure 1B:
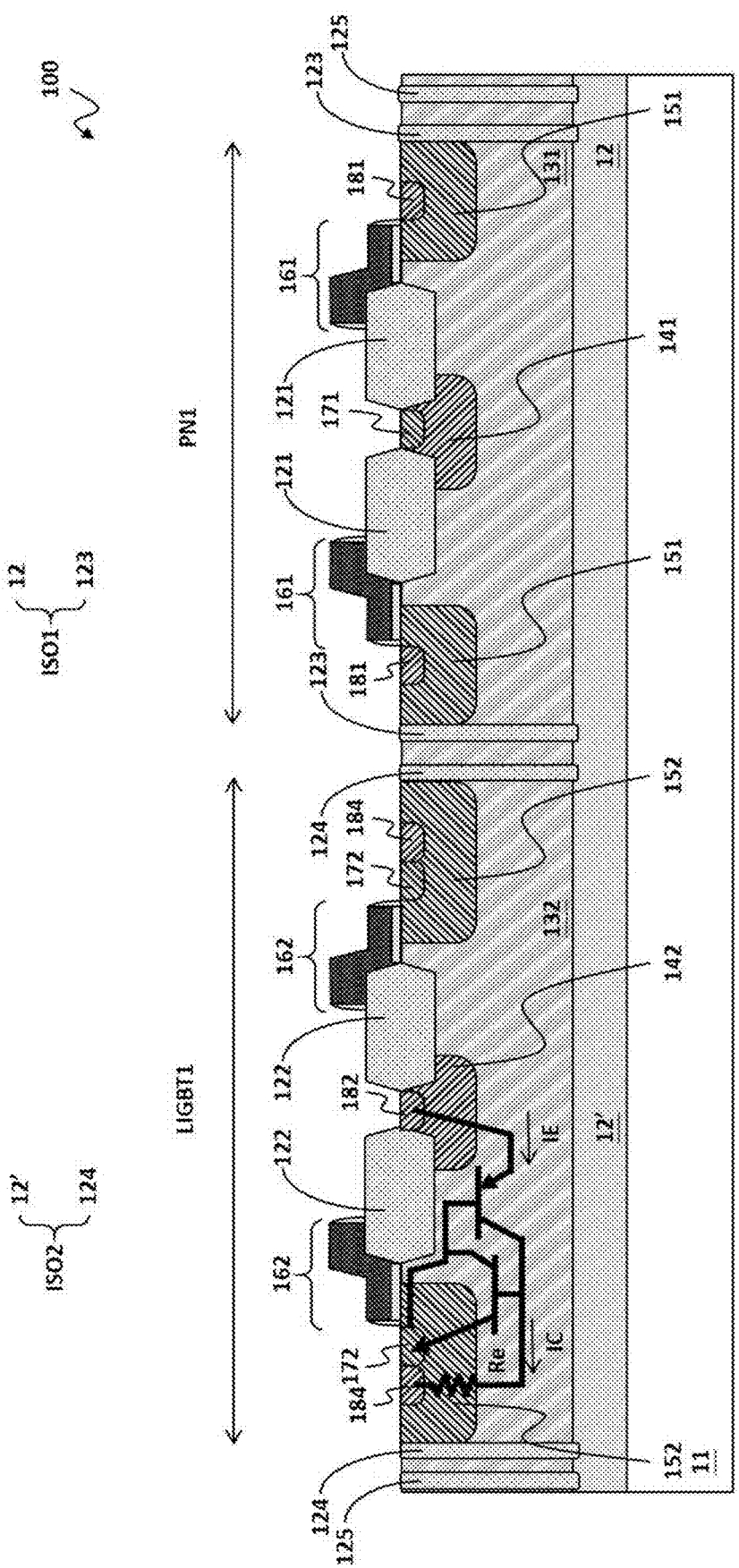
Figure 1C:
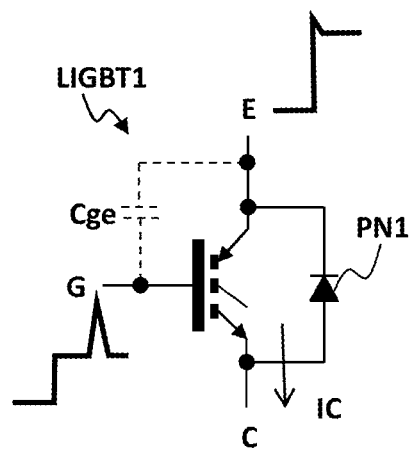
FIGS. 1C and 1D show schematic diagrams illustrating the power device 100 by circuit symbols and characteristic curves of the power device 100, respectively.
Figure 1D:
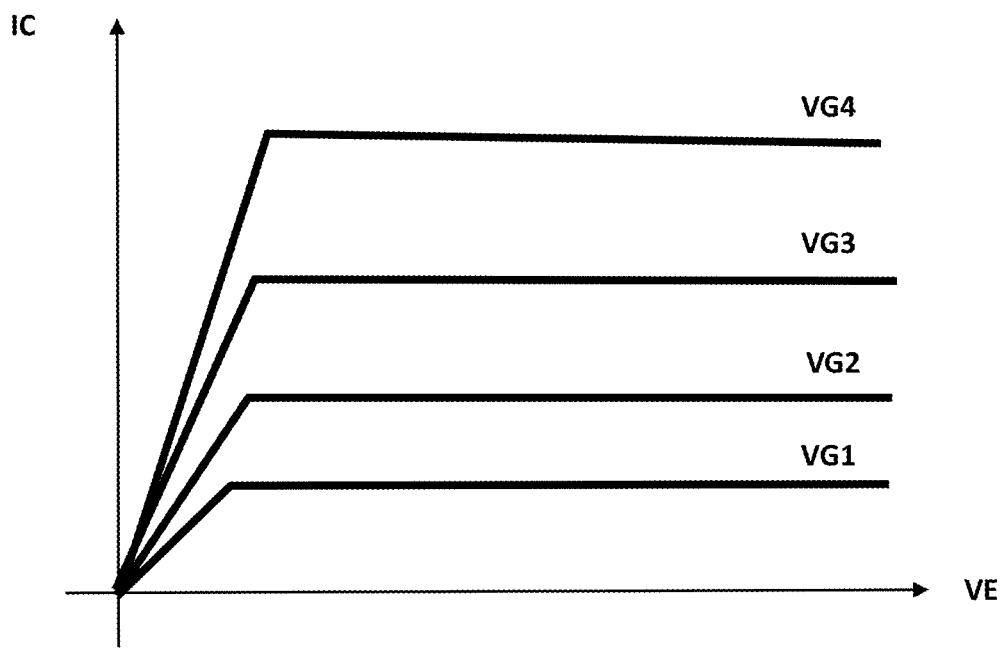
Figure 2A:
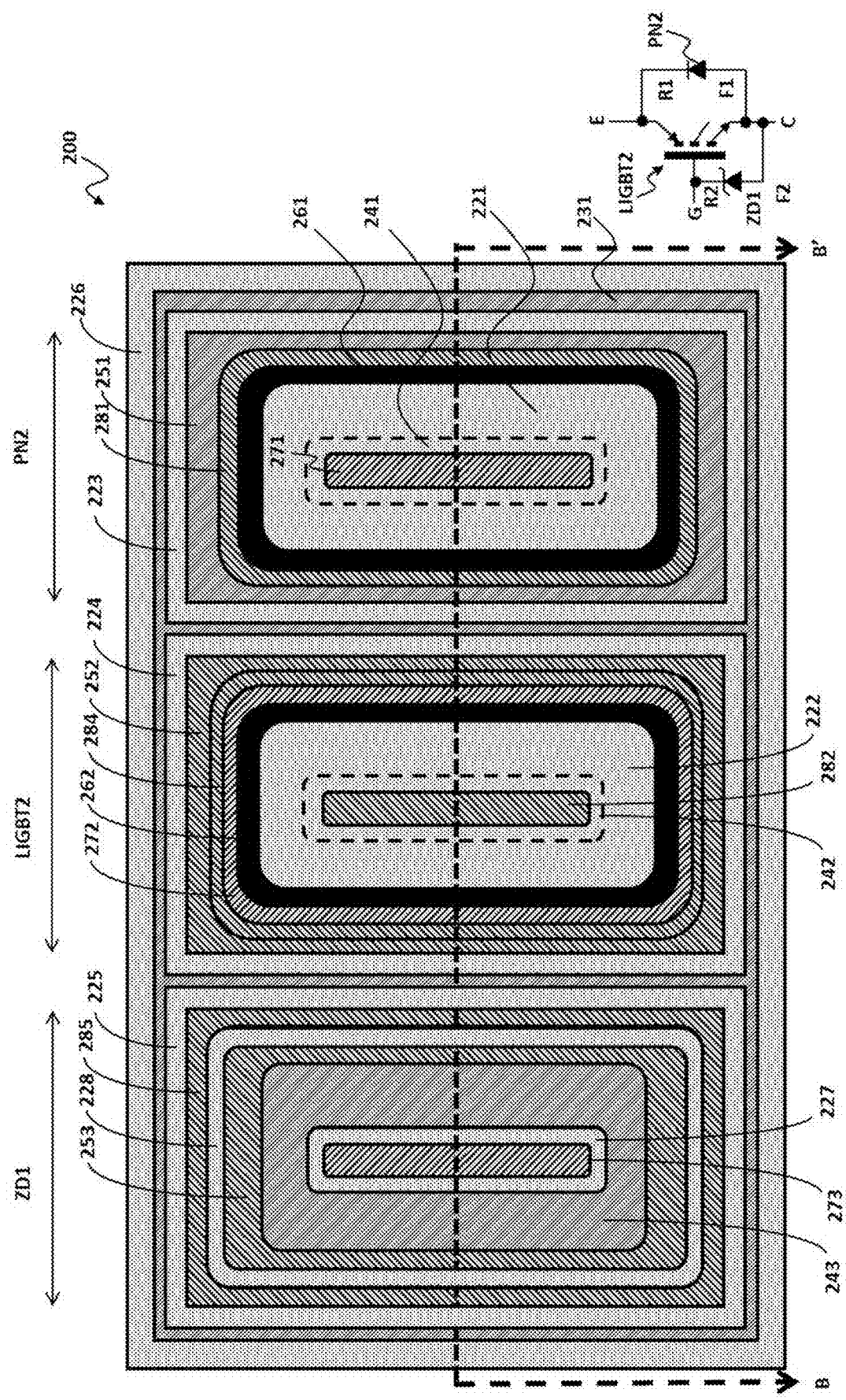
FIGS. 2A-2B show schematic diagrams of a power device according to an embodiment of the present invention.
Figure 2B:
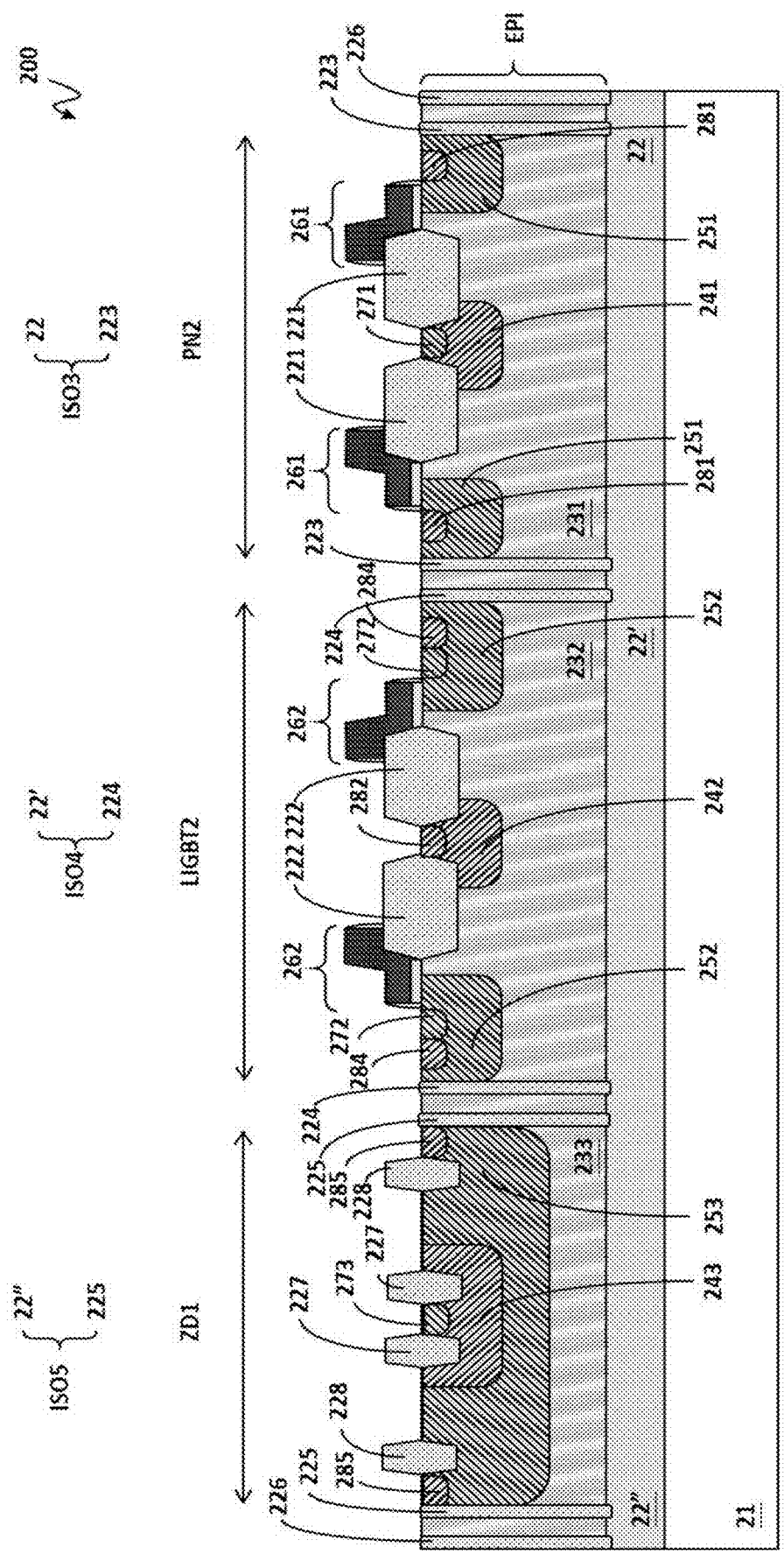

Please refer to FIGS. 2A-2B, which show a schematic diagram of a power device according to an embodiment of the present invention. The power device 200 of the present invention is formed on a semiconductor substrate 21 and is configured to operably drive a motor. The power device 200 comprises: a lateral insulated gate bipolar transistors (LIGBT) LIGBT2, a PN diode PN2 and a clamp diode (in this embodiment, the clamp diode is implemented as a Zener diode ZD1). As shown in FIGS. 2A-2B, the power device 200 is formed on the semiconductor substrate 21. The power device 200 comprises: the LIGBT (LIGBT2), the PN diode PN2 and the Zener diode ZD1. The Zener diode ZD1 functions as a clamp diode, which is configured to operably clamp a gate voltage applied to a gate 262 of the LIGBT (LIGBT2) not to be higher than a predetermined voltage threshold, to avoid triggering the latch-up effect, so as to protect the power device 200.

FIG. 2B is a cross sectional view of the power device 200 taken along B-B' line of FIG. 2A. In the power device 200, the LIGBT (LIGBT2), the PN diode PN2 and the Zener diode ZD1 are coupled to one another in a manner as illustrated by a small diagram of circuit symbols in FIG. 2A. In the small diagram of circuit symbols of FIG. 2A, the LIGBT (LIGBT2) has a gate G, an emitter E and a drain C. The PN diode PN2 has a forward terminal F1 and a reverse terminal R1. The Zener diode ZD1 has a forward terminal F2 and a reverse terminal R2. The PN diode PN2 is connected in parallel to the LIGBT (LIGBT2). The Zener diode ZD1 is electrically connected between the gate G and the drain C of the LIGBT (LIGBT2). The drain C of the LIGBT (LIGBT2) is electrically connected to the forward terminal F1 of the PN diode PN2, whereas, the emitter E of the LIGBT (LIGBT2) is electrically connected to the reverse terminal R1 of the PN diode PN2. The drain C of the LIGBT (LIGBT2) is electrically connected to the forward terminal F2 of the Zener diode ZD1, whereas, the gate G of the LIGBT (LIGBT2) is electrically connected to the reverse terminal R2 of the Zener diode ZD1.

That the power device 200 includes only one single LIGBT (LIGBT2) in the above-mentioned preferred embodiment is only an illustrative example, but not for limiting the scope of the present invention. In other embodiments, it is also practicable and within the scope of the present invention that the power device 200 can include two or more LIGBTs which are connected in parallel to one another. In other embodiments, it is also practicable and within the scope of the present invention that the power device 200 can include plural PN diodes. In one embodiment, in the power device 200, the number of the PN diodes is less than the number of the LIGBTs.

The PN diode PN2 includes: a first field oxide region 221, a first N-type region 231, a first N-type extension region 241, a first P-type well 251, a gate 261, a first reverse terminal 271 and a first forward terminal 281. The bottom and sides of the PN diode PN2 are encompassed by a first insulation structure ISO3. The first insulation structure ISO3 includes a first insulation bottom layer 22 and a first insulation side wall 223.

The first N-type region 231 is formed in an epitaxial layer EPI of the semiconductor substrate 21. The first P-type well 251 is formed in the first N-type region 231. The first N-type extension region 241 is formed in the first N-type region 231. The first N-type extension region 241 and the first P-type well 251 are separated from each other by the first N-type region 231. The first reverse terminal 271 has N conductivity type and is formed in the first N-type extension region 241. The first reverse terminal 271 is configured to serve as an electric contact of the first N-type extension region 241. The first forward terminal 281 has P conductivity type and is formed in the first P-type well 251. The first forward terminal 281 is configured to serve as an electric contact of the first P-type well 251.

The LIGBT (LIGBT2) is formed on the semiconductor substrate 21. As shown in FIGS. 2A-2B, the LIGBT (LIGBT2) includes: a second field oxide region 222, a second N-type region 232, a second N-type extension region 242, a second P-type well 252, a gate 262, a drain 272, an emitter 282 and a P-type contact 284. The bottom and the sides of the LIGBT (LIGBT2) are encompassed by a second insulation structure ISO4. The second insulation structure ISO4 includes a second insulation bottom layer 22' and a second insulation side wall 224. Under a case where there are plural LIGBTs LIGBT2, these plural LIGBTs LIGBT2 are electrically connected in parallel to one another. That is, the gates 262, the drains 272, the emitters 282 and the P-type contacts 284 of different LIGBTs LIGBT2 are correspondingly electrically connected to one another.

The second N-type region 231 is formed in the epitaxial layer EPI of the semiconductor substrate 21. The second P-type well 252 is formed in the second N-type region 232. The drain has N conductivity type and is formed in the second P-type well 252. The P-type contact 284 is formed in the second P-type well 252, wherein the P-type contact 284 is configured to serve as an electric contact of the second P-type well 252. The gate 262 is formed on the epitaxial layer EPI. A part of the gate 262 is connected on the second P-type well 252. The second N-type extension region 242 is formed in the second N-type region 232. The second N-type extension region 242 and the second P-type well 252 are separated from each other by the second N-type region 232. The emitter 282 has P conductivity type and is formed in the second N-type extension region 242.

The Zener diode ZD1 is formed on the semiconductor substrate 21. As shown in FIGS. 2A-2B, the Zener diode ZD1 includes: a third field oxide region 227, a fourth field oxide region 228, a third N-type region 233, a third N-type extension region 243, a third P-type well 253, a second reverse terminal 273 and a second forward terminal 285. The bottom and the sides of the Zener diode ZD1 are encompassed by a third insulation structure ISO5. The third insulation structure ISO5 includes a third insulation bottom layer 22" and a third insulation side wall 225.

The third P-type well 253 is formed in the epitaxial layer EPI of the semiconductor substrate 21. The second forward terminal 285 has P conductivity type and is formed in the third P-type well 253. The second forward terminal 285 is configured to serve as the clamp forward terminal and an electric contact of the third P-type well 253. The third N-type extension region 243, is formed in the third P-type well 253. The second reverse terminal 273 has N conductivity type and is formed in the third N-type extension region 243. The second reverse terminal 273 is configured to serve as the clamp reverse terminal and an electric contact of the third N-type extension region 243.

As shown in FIGS. 2A-2B, a fourth insulation side wall 226 forms a closed surrounding side wall, which encloses the first insulation side wall 223, the second insulation side wall 224 and the third insulation side wall 225 within the fourth insulation side wall 226. That is, the power device 200 is encompassed by the closed surrounding side wall formed by the fourth insulation side wall 226.

The first insulation bottom layer 22, the second insulation bottom layer 22' and the third insulation bottom layer 22" are formed on the semiconductor substrate 21. The semiconductor substrate 21 can be, for example but not limited to, a P-type or an N-type semiconductor silicon substrate. In other embodiments, the semiconductor substrate 21 can be any other type of semiconductor substrate. In one embodiment, for example, a silicon dioxide layer is formed on the semiconductor substrate 21, wherein a part of the silicon dioxide layer serves as the first insulation bottom layer 22, another part of the silicon dioxide layer serves as the second insulation bottom layer 22', and still another part of the silicon dioxide layer serves as the third insulation bottom layer 22"; and, an N-type epitaxial layer for example is formed on the silicon dioxide layer, wherein a part of the N-type epitaxial layer serves as the first N-type region 231, another part of the N-type epitaxial layer serves as the second N-type region 232, and still another part of the N-type epitaxial layer serves as the third N-type region 233. The above-mentioned semiconductor substrate 21, silicon dioxide layer and N-type epitaxial layer can be implemented through adopting an silicon on insulator (SOI) wafer, which is well known to those skilled in the art, so the details thereof are not redundantly explained here.

The first insulation side wall 223, the second insulation side wall 224, the third insulation side wall 225 and the fourth insulation side wall 226 can be simultaneously formed by: first forming respective deep trenches by a same deep trench etching process step; next depositing insulation materials, for example but not limited to silicon dioxide, into the above-mentioned deep trenches by a same deposition process step, to form the first insulation side wall 223, the second insulation side wall 224, the third insulation side wall 225 and the fourth insulation side wall 226 simultaneously. The first insulation side wall 223, the second insulation side wall 224, the third insulation side wall 225 and the fourth insulation side wall 226 are in contact with the underneath silicon dioxide layer which is in contact with the semiconductor substrate 21, so that the first insulation side wall 223, the second insulation side wall 224, the third insulation side wall 225 and the fourth insulation side wall 226 can respectively form an enclosed region in the epitaxial layer. In one embodiment, the bottom and the sides of the PN diode PN2 are encompassed by a first insulation structure ISO3; the bottom and the sides of the LIGBT (LIGBT2) are encompassed by a second insulation structure ISO4; the bottom and the sides of the Zener diode ZD1 are encompassed by a third insulation structure ISO5.

Please still refer to FIGS. 2A-2B. The first N-type extension region 241, the second N-type extension region 242 and the third N-type extension region 243 can be simultaneously formed by, for example but not limited to, first defining implanted regions of the first N-type extension region 241, the second N-type extension region 242 and the third N-type extension region 243 by a same lithography process step, and next implanting N-type impurities in the regions defined by the above-mentioned lithography process step in the form of accelerated ions, to form the first N-type extension region 241, the second N-type extension region 242 and the third N-type extension region 243. The first N-type extension region 241, the second N-type extension region 242 and the third N-type extension region 243 have N conductivity type. The first N-type extension region 241, the second N-type extension region 242 and the third N-type extension region 243 are formed in the above-mentioned N-type epitaxial layer. And, the first N-type extension region 241, the second N-type extension region 242 and the third N-type extension region 243 are beneath and in contact with the upper surface of the N-type epitaxial layer.

The first field oxide region 221, the second field oxide region 222, the third field oxide region 227 and the fourth field oxide region 228 can be simultaneously formed on and in contact with the upper surface of the N-type epitaxial layer via, for example but not limited to, a same oxidation process step. The first field oxide region 221, the second field oxide region 222, the third field oxide region 227 and the fourth field oxide region 228 are not limited to the local oxidation of silicon (LOCOS) structure as shown in FIG. 2B; for example, they may be shallow trench isolation (STI) structures instead. As shown in FIG. 2A, each of the first field oxide region 221, the second field oxide region 222, the third field oxide region 227 and the fourth field oxide region 228 have a closed surrounding configuration from top view. The first field oxide region 221, the second field oxide region 222, the third field oxide region 227 and the fourth field oxide region 228 encompass the first reverse terminal 271, the emitter 282 and the second reverse terminal 273, respectively.

The first P-type well 251 and the second P-type well 252 can be simultaneously formed by, for example but not limited to, first defining implanted regions of the first P-type well 251 and the second P-type well 252 by a same lithography process step, and next implanting P-type impurities in the regions defined by the above-mentioned lithography process step in the form of accelerated ions, to form the first P-type well 251 and the second P-type well 252. The first P-type well 251 and the second P-type well 252 both have P conductivity type. The first P-type well 251 and the second P-type well 252 are both formed in the above-mentioned N-type epitaxial layer. And, the first P-type well 251 and the second P-type well 252 are both beneath and in contact with the upper surface of the N-type epitaxial layer. As shown in FIG. 2A, each of the first P-type well 251 and the second P-type well 252 has a closed surrounding configuration from top view; these closed surrounding configurations encompass the first field oxide region 221 and the second field oxide region 222, respectively.

As shown in FIG. 2A, each of the gate 261 and the gate 262 has a closed surrounding configuration from top view. According to the top view of FIG. 2A, the gate 261 is formed on and in contact with a part of the first field oxide region 221 and the gate 261 encircles another part of the first field oxide region 221. According to the top view of FIG. 2A, the gate 262 is formed on and in contact with a part of the second field oxide region 222 and the gate 262 encircles another part of the second field oxide region 222.

The gate 261 and the gate 262 can be simultaneously formed via, for example but not limited to, a same gate formation process step. The gate 261 and the gate 262 include their own respective dielectric layers, conductive layers and spacer layers, which is well known to those skilled in the art, so the details thereof are not redundantly explained here. The above-mentioned gate formation process step for example comprises: a lithography process step and an oxidation process step for forming the dielectric layer; a lithography process step and a deposition process step for forming the conductive layer; and a deposition process step and an etching process step for forming the spacer layer.

The first forward terminal 281, the emitter 282, the P-type contact 284 and the second forward terminal 285 can be simultaneously formed by, for example but not limited to, first defining implanted regions of the first forward terminal 281, the emitter 282, the P-type contact 284 and the second forward terminal 285 by a same lithography process step, and next implanting P-type impurities in the regions defined by the above-mentioned lithography process step in the form of accelerated ions, to form the first forward terminal 281, the emitter 282, the P-type contact 284 and the second forward terminal 285. The first forward terminal 281, the emitter 282, the P-type contact 284 and the second forward terminal 285 have P conductivity type. The first forward terminal 281, the emitter 282, the P-type contact 284 and the second forward terminal 285 are formed in the first P-type well 251, the second N-type extension region 242, the second P-type well 252 and the third P-type well 253, respectively. The first forward terminal 281, the emitter 282, the P-type contact 284 and the second forward terminal 285 are beneath and in contact with the upper surface of the N-type epitaxial layer. As shown in FIG. 2A, each of the first forward terminal 281, the P-type contact 284 and the second forward terminal 285 has a closed surrounding configuration from top view; these closed surrounding configurations encompass the gate 261, the drain 272 and the fourth field oxide region 228, respectively.

The first reverse terminal 271, the drain 272 and the second reverse terminal 273 can be simultaneously formed by, for example but not limited to, first defining implanted regions of the first reverse terminal 271, the drain 272 and the second reverse terminal 273 by a same lithography process step (which includes adopting the gate 262 as a mask), and next implanting N-type impurities in the regions defined by the above-mentioned lithography process step in the form of accelerated ions, to form the first reverse terminal 271, the drain 272 and the second reverse terminal 273. The first reverse terminal 271, the drain 272 and the second reverse terminal 273 have N conductivity type. The first reverse terminal 271, the drain 272 and the second reverse terminal 273 are formed in the above-mentioned N-type epitaxial layer. And, the first reverse terminal 271, the drain 272 and the second reverse terminal 273 are beneath and in contact with the upper surface of the N-type epitaxial layer. As shown in FIG. 2A, the drain 272 has a closed surrounding configuration from top view, which encompasses the gate 262.

The present invention is advantageous over the prior art, in that: first, in this embodiment, the Zener diode ZD1 can clamp a gate voltage applied to the gate not to be higher than a predetermined voltage threshold; second, the Zener diode ZD1 can prevent the voltage across a gate-emitter capacitor Cge from being too huge, to avoid a situation that a voltage applied onto the gate is too high, so that the base current and the conduction current IC do not increase drastically, thus avoiding triggering the unwanted PNPN latch-up effect of the LIGBT (LIGBT1). Furthermore, the Zener diode ZD1 and the LIGBT (LIGBT2) are formed by a same lithography process step and a same ion implantation process step, which does not increase any extra manufacturing cost.

Figure 3A:
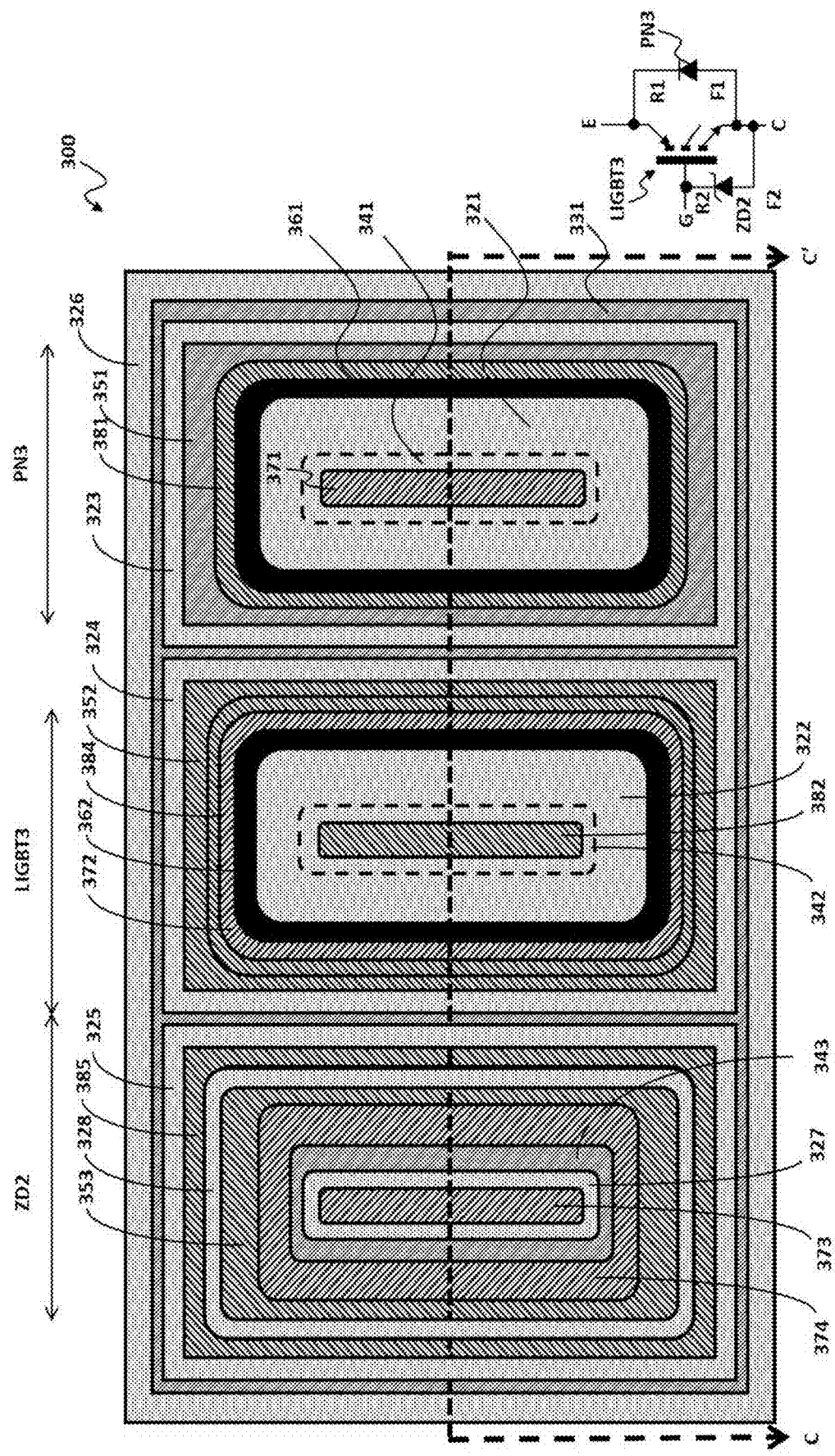
FIGS. 3A-3B show schematic diagrams of a power device according to another embodiment of the present invention.
Figure 3B:
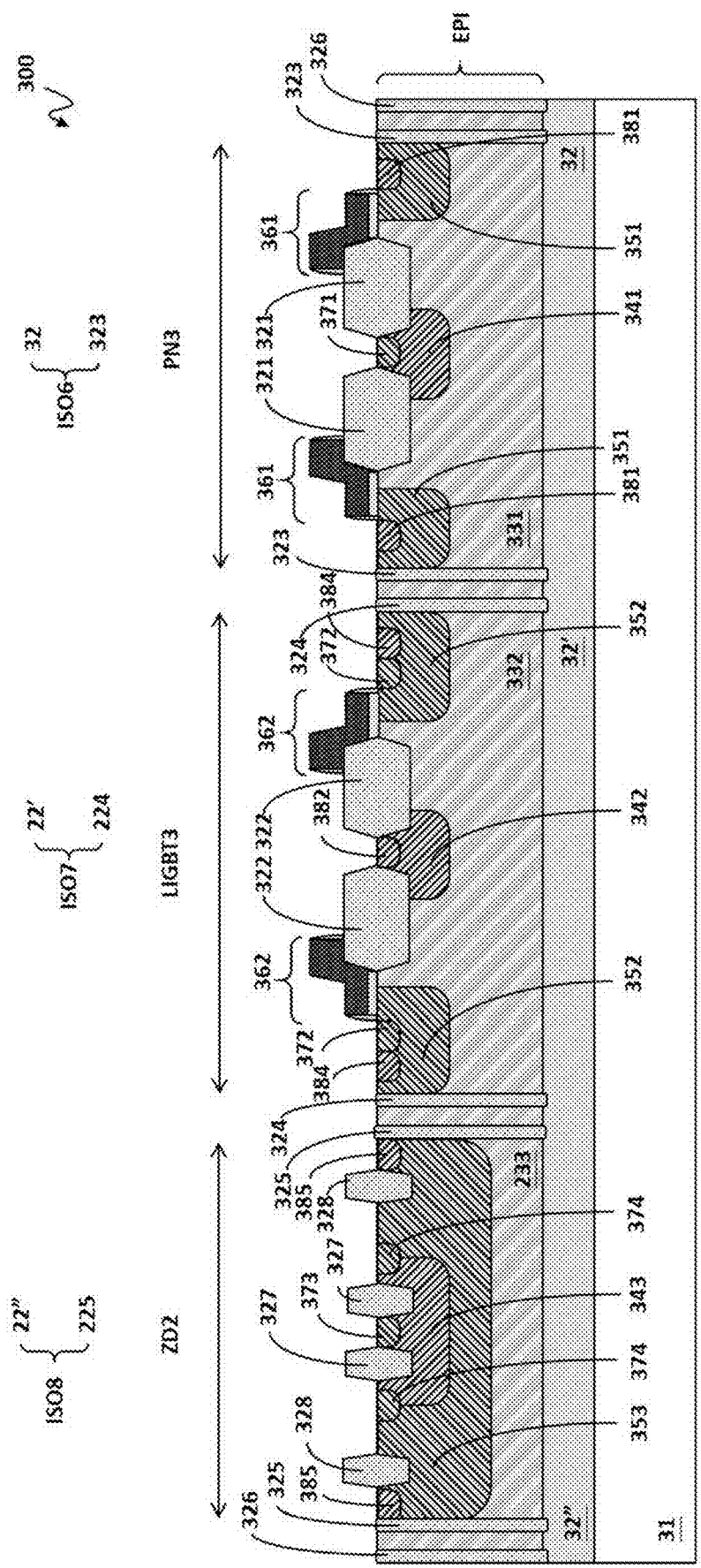

Please refer to FIGS. 3A-3B, which show a schematic diagram of a power device according to another embodiment of the present invention. As shown in FIGS. 3A-3B, the power device 300 of the present invention is formed on a semiconductor substrate 21. The power device 300 comprises: an LIGBT (LIGBT3), a PN diode PN3 and a Zener diode ZD2. The Zener diode ZD2 functions as a clamp diode, which is configured to operably clamp a gate voltage applied to a gate 362 of the LIGBT (LIGBT3) not to be higher than a predetermined voltage threshold, to avoid triggering the latch-up effect, so as to protect the power device 300.

FIG. 3B is a cross sectional view of the power device 300 taken along C-C' line of FIG. 3A. In the power device 300, the LIGBT (LIGBT3), the PN diode PN3 and the Zener diode ZD2 are coupled to one another in a manner as illustrated by a small diagram of circuit symbols in FIG. 3A. In the small diagram of circuit symbols of FIG. 3A, the LIGBT (LIGBT3) has a gate G, an emitter E and a drain C. The PN diode PN3 has a forward terminal F1 and a reverse terminal R1. The Zener diode ZD2 has a forward terminal F2 and a reverse terminal R2. The PN diode PN3 is connected in parallel to the LIGBT (LIGBT3). The Zener diode ZD2 is electrically connected between the gate G and the drain C of the LIGBT (LIGBT3). The drain C of the LIGBT (LIGBT3) is electrically connected to the forward terminal F1 of the PN diode PN3, whereas, the emitter E of the LIGBT (LIGBT3) is electrically connected to the reverse terminal R1 of the PN diode PN3. The drain C of the LIGBT (LIGBT3) is electrically connected to the forward terminal F2 of the Zener diode ZD2, whereas, the gate G of the LIGBT (LIGBT3) is electrically connected to the reverse terminal R2 of the Zener diode ZD2.

The PN diode PN3 includes: a first field oxide region 321, a first N-type region 331, a first N-type extension region 341, a first P-type well 351, a gate 361, a first reverse terminal 371 and a first forward terminal 381. The bottom and the sides of the PN diode PN3 is encompassed by a first insulation structure ISO6. The first insulation structure ISO6 includes a first insulation bottom layer 32 and a first insulation side wall 323.

The LIGBT (LIGBT3) is formed on the semiconductor substrate 31. As shown in FIGS. 3A-3B, the LIGBT (LIGBT3) includes: a second field oxide region 322, a second N-type region 332, a second N-type extension region 342, a second P-type well 352, a gate 362, a drain 372, an emitter 382 and a P-type contact 384. The bottom and the sides of the LIGBT (LIGBT3) are encompassed by a second insulation structure ISO7. The second insulation structure ISO7 includes a second insulation bottom layer 32' and a second insulation side wall 324. Under a case where there are plural LIGBTs LIGBT3, these plural LIGBTs LIGBT3 are electrically connected in parallel to one another. That is, the gates 262, the drains 272, the emitters 282 and the P-type contacts 284 of different LIGBTs LIGBT2 are correspondingly electrically connected to one another.

The Zener diode ZD2 is formed on the semiconductor substrate 31. As shown in FIGS. 3A-3B, the Zener diode ZD2 includes: a third field oxide region 327, a fourth field oxide region 328, a third N-type region 333, a third N-type extension region 343, a third P-type well 353, a second reverse terminal 373, an N-type adjustment region 374 and a second forward terminal 385. The bottom and the sides of the Zener diode ZD2 are encompassed by a third insulation structure ISO8. The third insulation structure ISO8 includes a third insulation bottom layer 32" and a third insulation side wall 325.

As shown in FIGS. 3A-3B, a fourth insulation side wall 326 forms a closed surrounding side wall, which encloses the first insulation side wall 323, the second insulation side wall 324 and the third insulation side wall 325 within the fourth insulation side wall 326. That is, the power device 300 is encompassed by the closed surrounding side wall formed by the fourth insulation side wall 326.

This embodiment of FIGS. 3A-3B is different from the embodiment of FIGS. 2A-2B, in that: as shown in FIGS. 3A-3B, in this embodiment, as compared to the power device 200, the Zener diode ZD2 of the power device 300 further includes the N-type adjustment region 374, which is formed beneath and in contact with an upper surface of the epitaxial layer EPI. The N-type adjustment region 374 beneath the upper surface lies between the third P-type well 353 and the third N-type extension region 343, to serve for adjusting a forward voltage of a PN junction formed between the third P-type well 353 and the third N-type extension region 343.

Figure 4A:
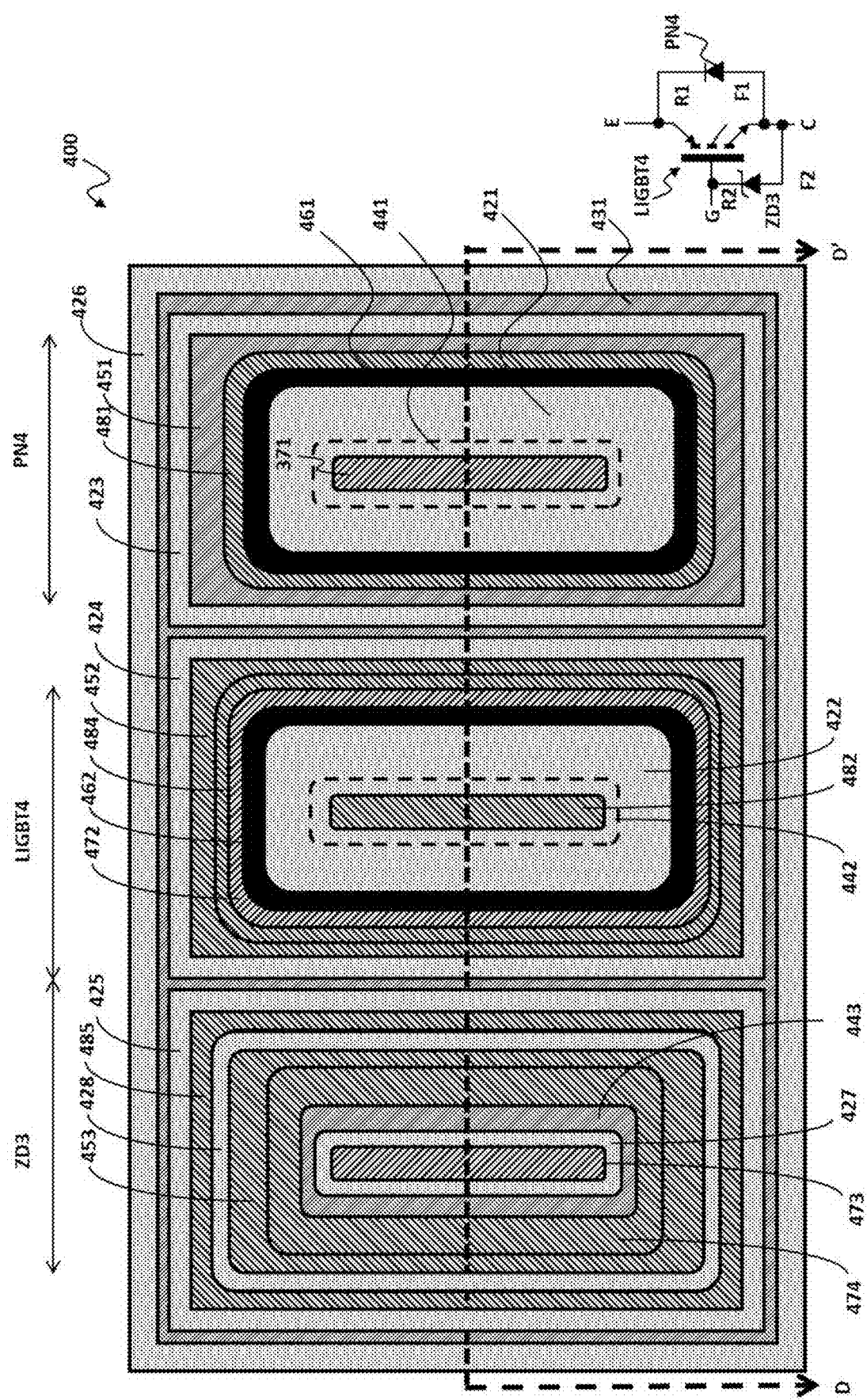
FIGS. 4A-4B show schematic diagrams of a power device according to yet another embodiment of the present invention.
Figure 4B:
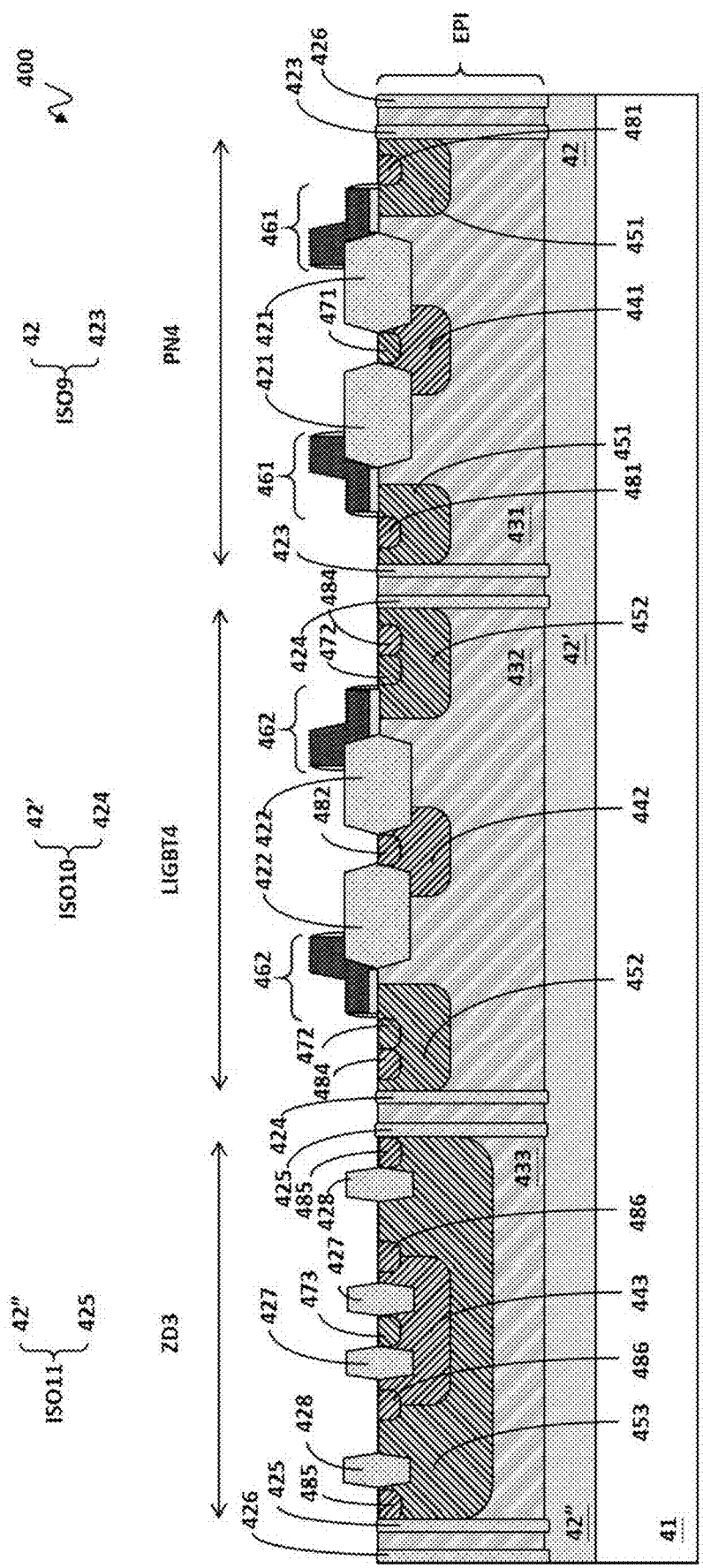

Please refer to FIGS. 4A-4B, which show a schematic diagram of a power device according to yet another embodiment of the present invention. As shown in FIGS. 4A-4B, the power device 400 of the present invention is formed on a semiconductor substrate 41. The power device 400 comprises: an LIGBT (LIGBT4), a PN diode PN4 and a Zener diode ZD3. The Zener diode ZD3 functions as a clamp diode, which is configured to operably clamp a gate voltage applied to a gate 462 of the LIGBT (LIGBT4) not to be higher than a predetermined voltage threshold, to avoid triggering the latch-up effect, so as to protect the power device 400.

FIG. 4B is a cross sectional view of the power device 400 taken along D-D' line of FIG. 4A. In the power device 400, the LIGBT (LIGBT4), the PN diode PN4 and the Zener diode ZD3 are coupled to one another in a manner as illustrated by a small diagram of circuit symbols in FIG. 4A. In the small diagram of circuit symbols of FIG. 4A, the LIGBT (LIGBT4) has a gate G, an emitter E and a drain C. The PN diode PN4 has a forward terminal F1 and a reverse terminal R1. The Zener diode ZD3 has a forward terminal F2 and a reverse terminal R2. The PN diode PN4 is connected in parallel to the LIGBT (LIGBT4). The Zener diode ZD3 is electrically connected between the gate G and the drain C of the LIGBT (LIGBT4). The drain C of the LIGBT (LIGBT4) is electrically connected to the forward terminal F1 of the PN diode PN4, whereas, the emitter E of the LIGBT (LIGBT4) is electrically connected to the reverse terminal R1 of the PN diode PN4. The drain C of the LIGBT (LIGBT4) is electrically connected to the forward terminal F2 of the Zener diode ZD3, whereas, the gate G of the LIGBT (LIGBT3) is electrically connected to the reverse terminal R2 of the Zener diode ZD3.

The PN diode PN4 includes: a first field oxide region 421, a first N-type region 431, a first N-type extension region 441, a first P-type well 451, a gate 461, a first reverse terminal 471 and a first forward terminal 481. The bottom and the sides of the PN diode PN4 are encompassed by a first insulation structure ISO9. The first insulation structure ISO9 includes a first insulation bottom layer 42 and a first insulation side wall 423.

The LIGBT (LIGBT4) is formed on the semiconductor substrate 41. As shown in FIGS. 4A-4B, the LIGBT (LIGBT4) includes: a second field oxide region 422, a second N-type region 432, a second N-type extension region 442, a second P-type well 452, a gate 462, a drain 472, an emitter 482 and a P-type contact 484. The bottom and the sides of the LIGBT (LIGBT4) are encompassed by a second insulation structure ISO10. The second insulation structure ISO10 includes a second insulation bottom layer 42' and a second insulation side wall 424. Under a case where there are plural LIGBTs LIGBT4, these plural LIGBTs LIGBT4 are electrically connected in parallel to one another. That is, the gates 462, the drains 472, the emitters 482 and the P-type contacts 484 of different LIGBTs LIGBT4 are correspondingly electrically connected to one another.

The Zener diode ZD3 is formed on the semiconductor substrate 41. As shown in FIGS. 4A-4B, the Zener diode ZD3 includes: a third field oxide region 427, a fourth field oxide region 428, a third N-type region 433, a third N-type extension region 443, a third P-type well 453, a second reverse terminal 473, a P-type adjustment region 486 and a second forward terminal 485. The bottom and the sides of the Zener diode ZD3 are encompassed by a third insulation structure ISO11. The third insulation structure ISO11 includes a third insulation bottom layer 42" and a third insulation side wall 425.

As shown in FIGS. 4A-4B, a fourth insulation side wall 426 forms a closed surrounding side wall, which encloses the first insulation side wall 423, the second insulation side wall 424 and the third insulation side wall 425 within the fourth insulation side wall 426. That is, the power device 400 is encompassed by the closed surrounding side wall formed by the fourth insulation side wall 426.

This embodiment of FIGS. 4A-4B is different from the embodiment of FIGS. 2A-2B, in that: as shown in FIGS. 4A-4B, in this embodiment, as compared to the power device 200, the Zener diode ZD3 of the power device 400 further includes the P-type adjustment region 486, which is formed beneath and in contact with an upper surface of the epitaxial layer EPI. The P-type adjustment region 486 beneath the upper surface lies between the third P-type well 453 and the third N-type extension region 443, to serve for adjusting a forward voltage of a PN junction formed between the third P-type well 453 and the third N-type extension region 443.

Figure 5A:
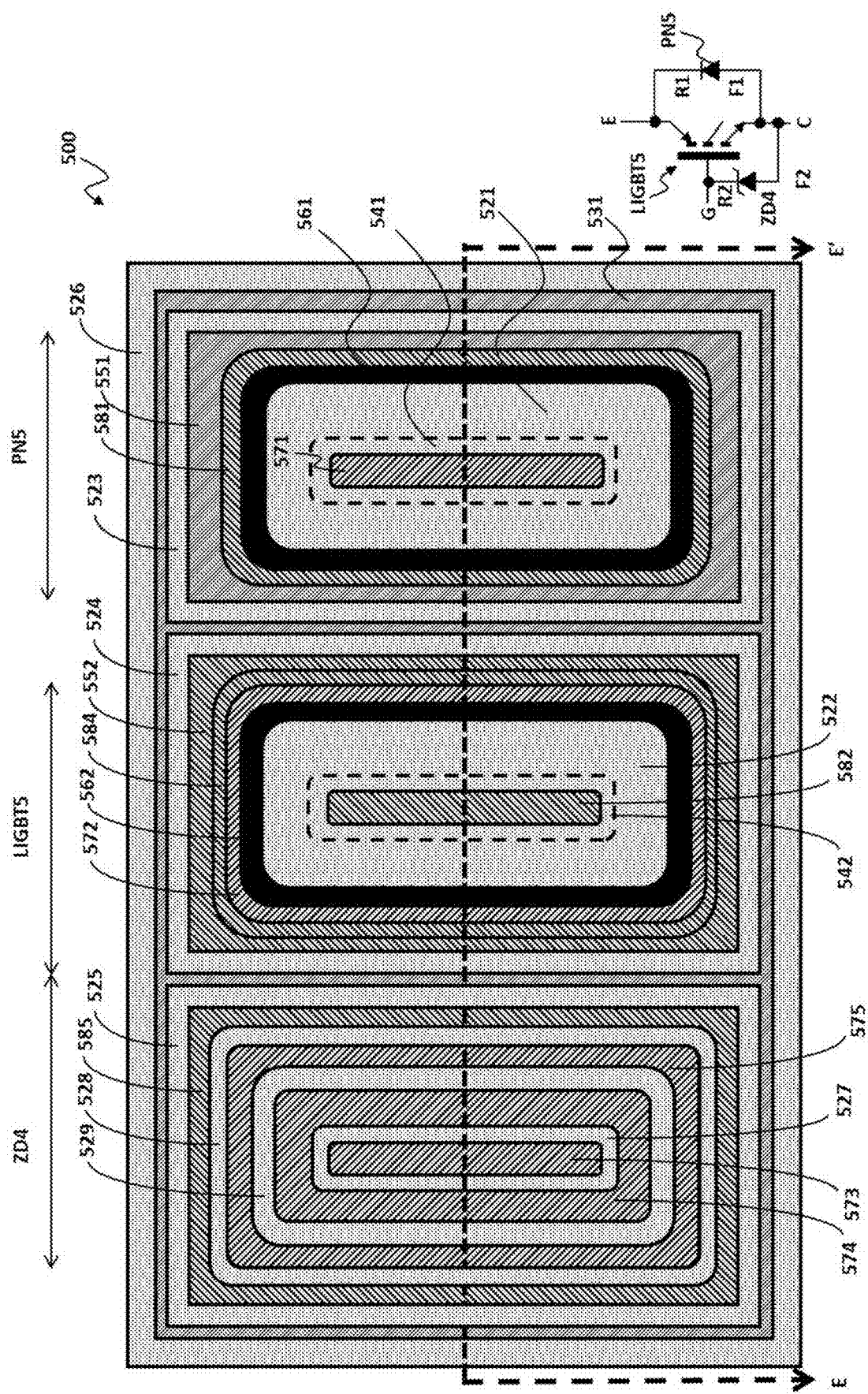
FIGS. 5A-5B show schematic diagrams of a power device according to still another embodiment of the present invention.
Figure 5B:
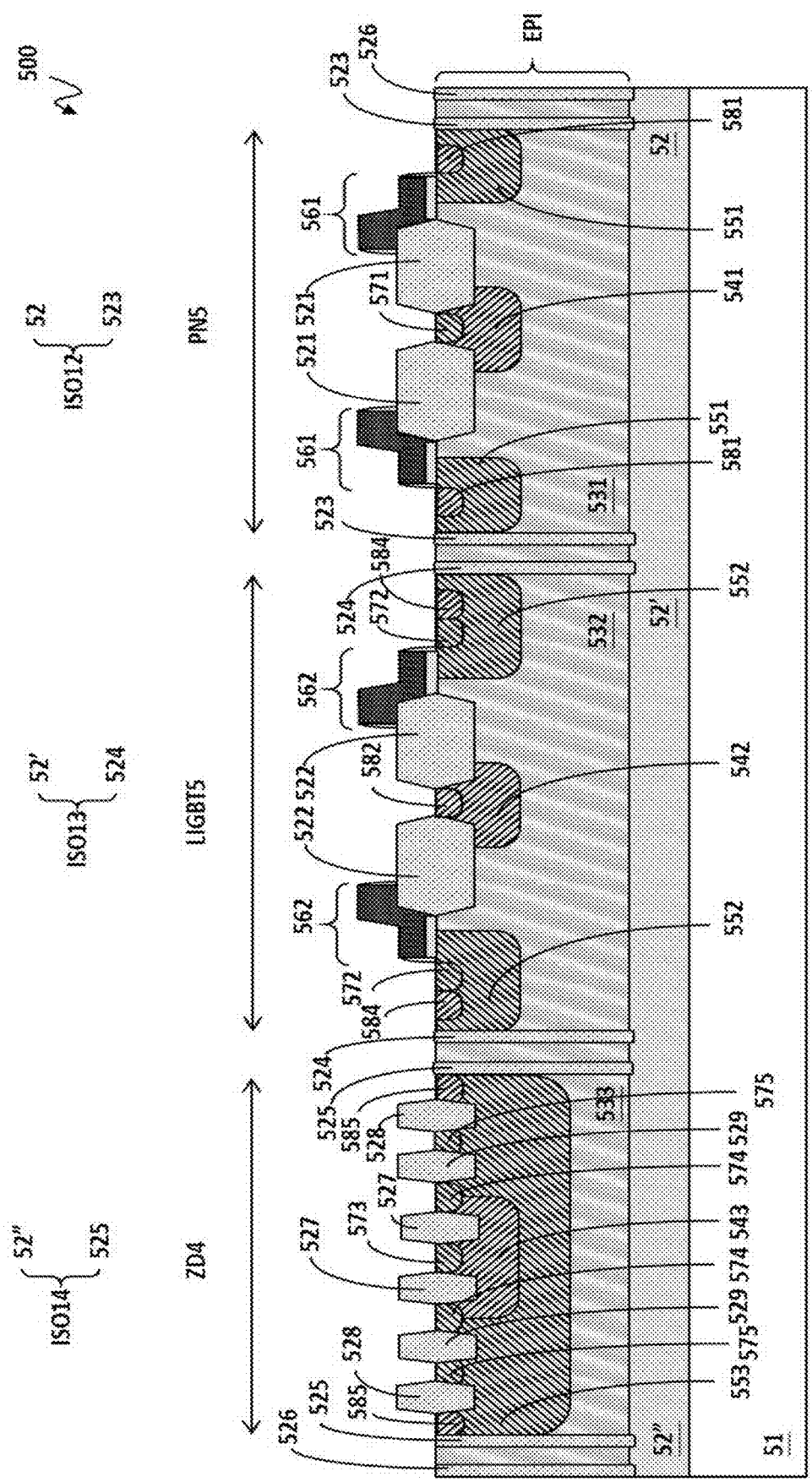

Please refer to FIGS. 5A-5B, which show a schematic diagram of a power device according to still another embodiment of the present invention. As shown in FIGS. 5A-5B, the power device 500 of the present invention is formed on a semiconductor substrate 51. The power device 500 comprises: an LIGBT (LIGBT5), a PN diode PN5 and a Zener diode ZD4. The Zener diode ZD4 functions as a clamp diode, which is configured to operably clamp a gate voltage applied to a gate 562 of the LIGBT (LIGBT5) not to be higher than a predetermined voltage threshold, to avoid triggering the latch-up effect, so as to protect the power device 500.

FIG. 5B is a cross sectional view of the power device 500 taken along E-E' line of FIG. 5A. In the power device 500, the LIGBT (LIGBT5), the PN diode PN5 and the Zener diode ZD4 are coupled to one another in a manner as illustrated by a small diagram of circuit symbols in FIG. 5A. In the small diagram of circuit symbols of FIG. 5A, the LIGBT (LIGBT5) has a gate G, an emitter E and a drain C.

The PN diode PN5 has a forward terminal F1 and a reverse terminal R1. The Zener diode ZD4 has a forward terminal F2 and a reverse terminal R2. The PN diode PN5 is connected in parallel to the LIGBT (LIGBT5). The Zener diode ZD4 is electrically connected between the gate G and the drain C of the LIGBT (LIGBT5). The drain C of the LIGBT (LIGBT5) is electrically connected to the forward terminal F1 of the PN diode PN5, whereas, the emitter E of the LIGBT (LIGBT5) is electrically connected to the reverse terminal R1 of the PN diode PN5. The drain C of the LIGBT (LIGBT5) is electrically connected to the forward terminal F2 of the Zener diode ZD4, whereas, the gate G of the LIGBT (LIGBT4) is electrically connected to the reverse terminal R2 of the Zener diode ZD4.

The PN diode PN5 includes: a first field oxide region 521, a first N-type region 531, a first N-type extension region 541, a first P-type well 551, a gate 561, a first reverse terminal 571 and a first forward terminal 581. The bottom and the sides of the PN diode PN5 are encompassed by a first insulation structure ISO12. The first insulation structure ISO12 includes a first insulation bottom layer 52 and a first insulation side wall 523.

The LIGBT (LIGBT5) is formed on the semiconductor substrate 51. As shown in FIGS. 5A-5B, the LIGBT (LIGBT5) includes: a second field oxide region 522, a second N-type region 532, a second N-type extension region 542, a second P-type well 552, a gate 562, a drain 572, an emitter 582 and a P-type contact 584. The bottom and the side of the LIGBT (LIGBT5) are encompassed by a second insulation structure ISO13. The second insulation structure ISO13 includes a second insulation bottom layer 52' and a second insulation side wall 524. Under a case where there are plural LIGBTs LIGBT5, these plural LIGBTs LIGBT5 are electrically connected in parallel to one another. That is, the gates 562, the drains 572, the emitters 582 and the P-type contacts 584 of different LIGBTs LIGBT5 are correspondingly electrically connected to one another.

The Zener diode ZD4 is formed on the semiconductor substrate 51. As shown in FIGS. 4A-4B, the Zener diode ZD4 includes: a third field oxide region 527, a fourth field oxide region 528, a fifth field oxide region 529, a third N-type region 533, a third N-type extension region 543, a third P-type well 553, a second reverse terminal 573, an N-type adjustment region 574, an electrostatic discharge (ESD) protection region 575 and a second forward terminal 585. The bottom and the sides of the Zener diode ZD4 are encompassed by a third insulation structure ISO14. The third insulation structure ISO14 includes a third insulation bottom layer 52" and a third insulation side wall 525.

As shown in FIGS. 5A-5B, a fourth insulation side wall 526 forms a closed surrounding side wall, which encloses the first insulation side wall 523, the second insulation side wall 524 and the third insulation side wall 525 within the fourth insulation side wall 526. That is, the power device 500 is encompassed by the closed surrounding side wall formed by the fourth insulation side wall 526.

This embodiment of FIGS. 5A-5B is different from the embodiment of FIGS. 3A-3B, in that: as shown in FIGS. 5A-5B, in this embodiment, as compared to the power device 300, the Zener diode ZD4 of the power device 500 further includes the ESD protection region 575 and the fifth field oxide region 529. The ESD protection region 575 has N conductivity type and is formed beneath and in contact with the upper surface of the epitaxial layer EPI. The ESD protection region beneath the upper surface lies between the third N-type extension region 543 and the second forward terminal 585. The ESD protection region 575, the third P-type well 553 and the third N-type extension region 543 together form an NPN transistor. The ESD protection region 575 is electrically connected to the second forward terminal 585. As a result, when the power device 500 is in contact with an electrostatic discharge voltage, the NPN transistor will be turned ON to avoid damaging the power device 500 by the electrostatic discharge voltage.

Figure 6A:
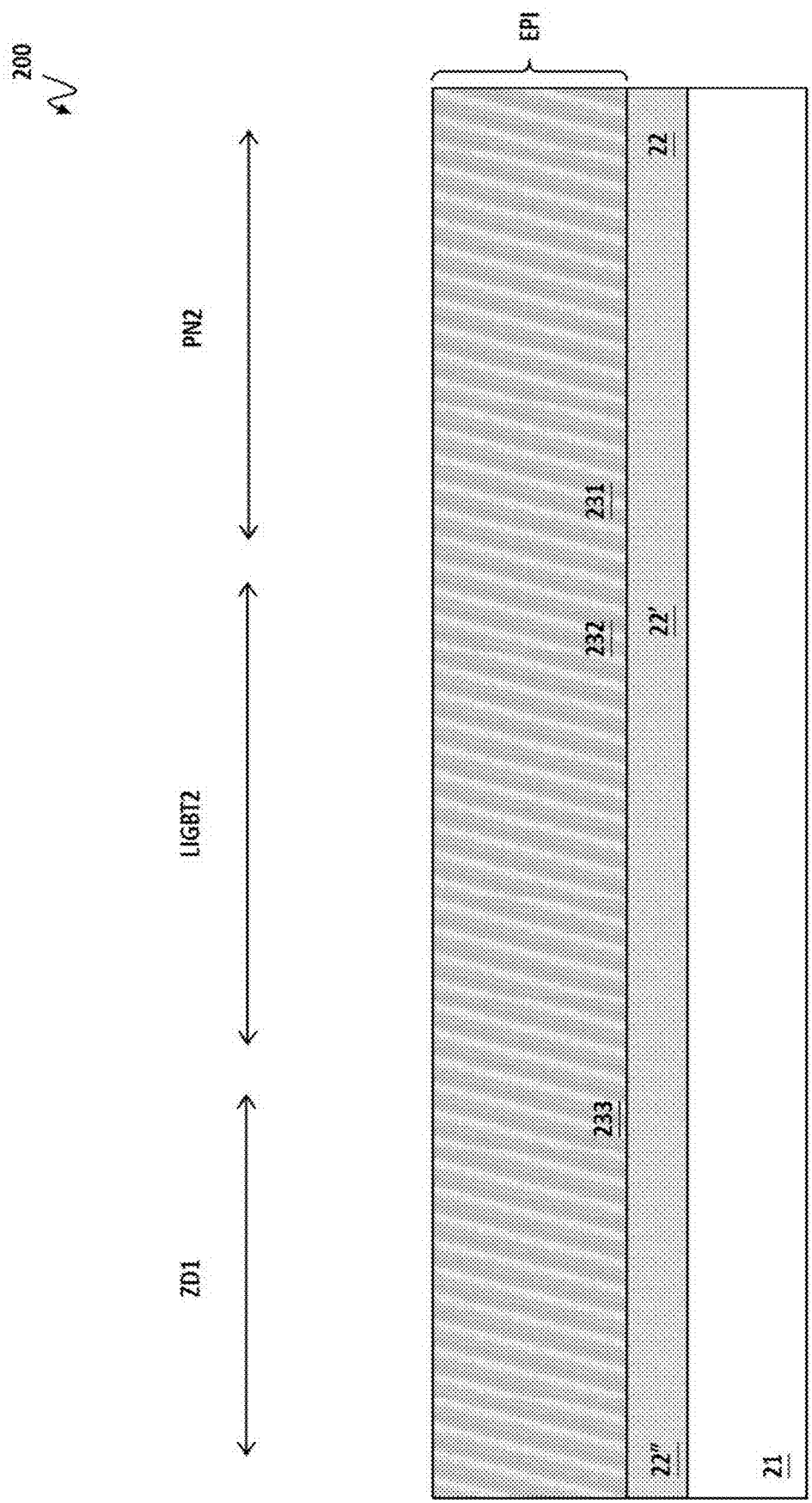
FIGS. 6A-6H show a schematic diagram of a manufacturing method of a power device according to an embodiment of the present invention.

Please refer to FIGS. 6A-6H, which show a schematic diagram of a manufacturing method of a power device 200 according to an embodiment of the present invention. FIGS. 6A-6I show a cross sectional view of a manufacturing method of the power device 200 as shown in FIG. 2B which is taken along B-B' line of FIG. 2A. As shown in FIG. 6A, first, a first insulation bottom layer 22, a second insulation bottom layer 22' and a third insulation bottom layer 22" are formed on a semiconductor substrate 21. The semiconductor substrate 21 can be, for example but not limited to, a P-type or an N-type semiconductor silicon substrate. In other embodiments, the semiconductor substrate 21 can be any other type of semiconductor substrate. In one embodiment, for example, a silicon dioxide layer is formed on the semiconductor substrate 21, wherein a part of the silicon dioxide layer serves as the first insulation bottom layer 22, another part of the silicon dioxide layer serves as the second insulation bottom layer 22', and still another part of the silicon dioxide layer serves as the third insulation bottom layer 22"; and, an N-type epitaxial layer for example is formed on the silicon dioxide layer, wherein a part of the N-type epitaxial layer serves as the first N-type region 231, another part of the N-type epitaxial layer serves as the second N-type region 232, and still another part of the N-type epitaxial layer serves as the third N-type region 233. The above-mentioned semiconductor substrate 21, silicon dioxide layer and N-type epitaxial layer can be implemented through adopting an silicon on insulator (SOI) wafer, which is well known to those skilled in the art, so the details thereof are not redundantly explained here.

Figure 6B:
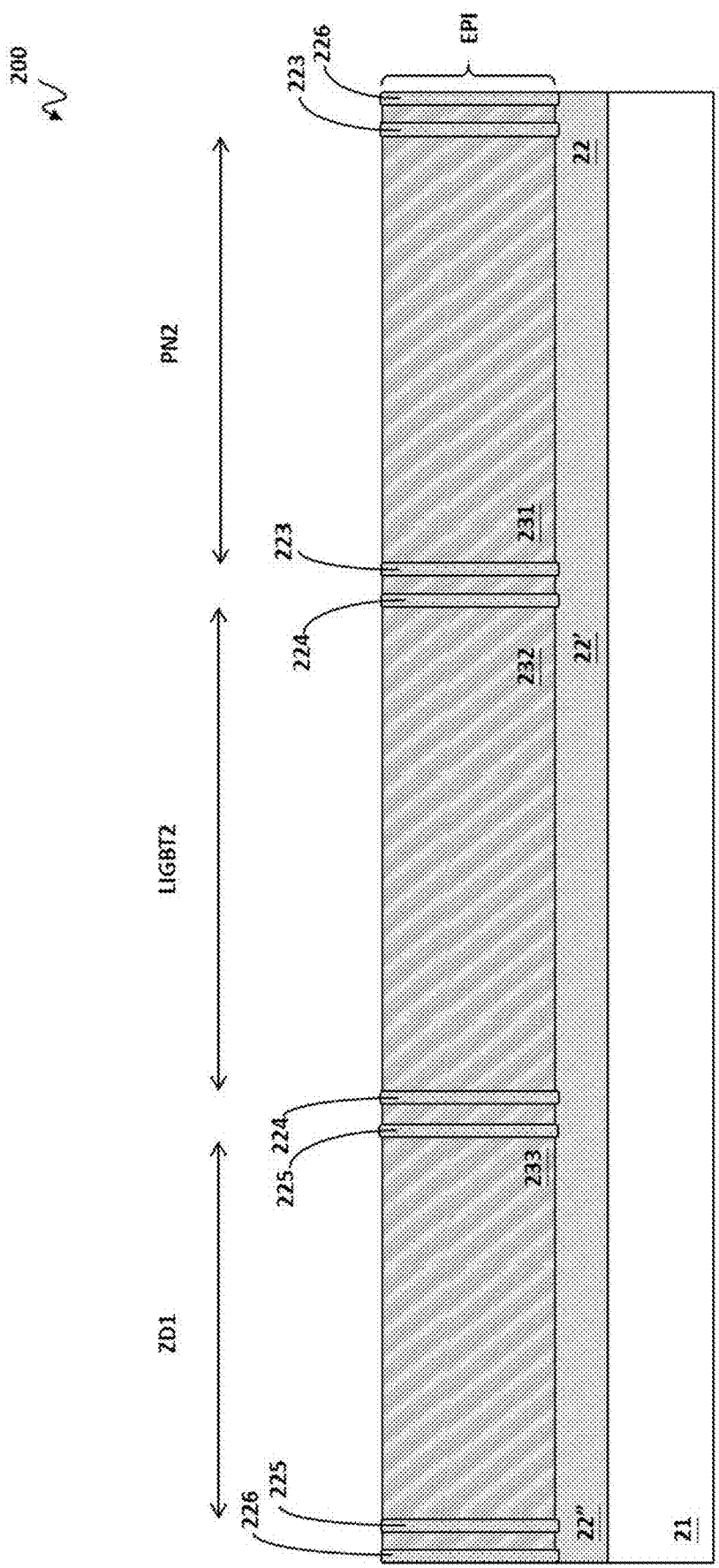

Next, as shown in FIG. 6B, the first insulation side wall 223, the second insulation side wall 224, the third insulation side wall 225 and the fourth insulation side wall 226 can be simultaneously formed by: first forming respective deep trenches by a same deep trench etching process step; next depositing insulation materials, for example but not limited to silicon dioxide, into the above-mentioned deep trenches by a same deposition process step, to form the first insulation side wall 223, the second insulation side wall 224, the third insulation side wall 225 and the fourth insulation side wall 226 simultaneously. The first insulation side wall 223, the second insulation side wall 224, the third insulation side wall 225 and the fourth insulation side wall 226 are in contact with the underneath silicon dioxide layer which is in contact with the semiconductor substrate 21, so that the first insulation side wall 223, the second insulation side wall 224, the third insulation side wall 225 and the fourth insulation side wall 226 can respectively form an enclosed region in the epitaxial layer EPI. In one embodiment, the bottom and the sides of the PN diode PN2 are encompassed by a first insulation structure ISO3; the bottom and the sides of the LIGBT (LIGBT2) are encompassed by a second insulation structure ISO4; the bottom and the sides of the Zener diode ZD1 are encompassed by a third insulation structure ISO5.

Figure 6C:
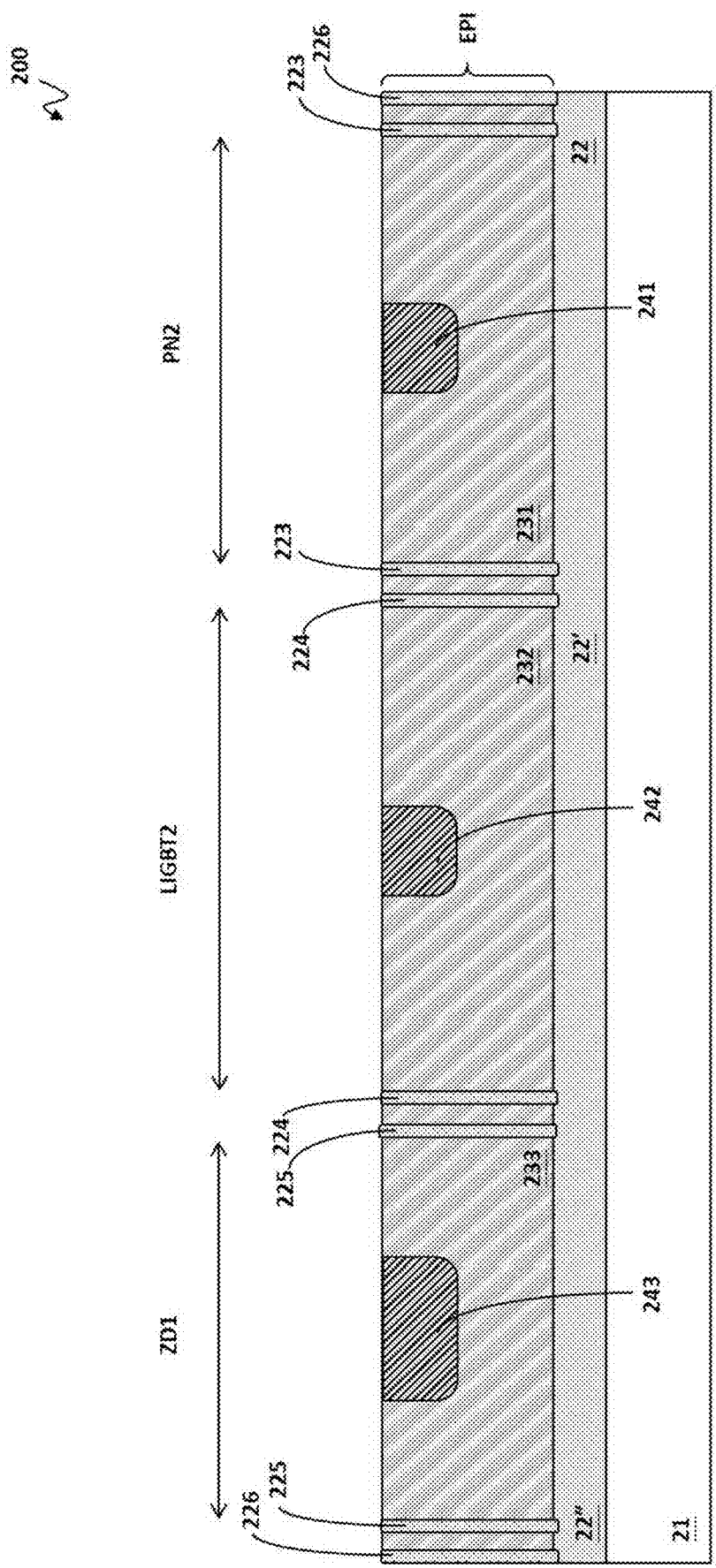

Next, as shown in FIG. 6C, the first N-type extension region 241, the second N-type extension region 242 and the third N-type extension region 243 are formed in the epitaxial layer EPI of the semiconductor substrate 21. To be more specific, the first N-type extension region 241, the second N-type extension region 242 and the third N-type extension region 243 can be simultaneously defined via, for example but not limited to, a same lithography process step. Next, the first N-type extension region 241, the second N-type extension region 242 and the third N-type extension region 243 can be simultaneously formed by, for example but not limited to, a same ion implantation process step which implants N-type impurities in the regions defined by the above-mentioned lithography process step in the form of accelerated ions, to form the first N-type extension region 241, the second N-type extension region 242 and the third N-type extension region 243. The first N-type extension region 241, the second N-type extension region 242 and the third N-type extension region 243 have N conductivity type. The first N-type extension region 241, the second N-type extension region 242 and the third N-type extension region 243 are formed in the above-mentioned N-type epitaxial layer; the first N-type extension region 241, the second N-type extension region 242 and the third N-type extension region 243 are beneath and in contact with the upper surface of the N-type epitaxial layer.

Figure 6D:
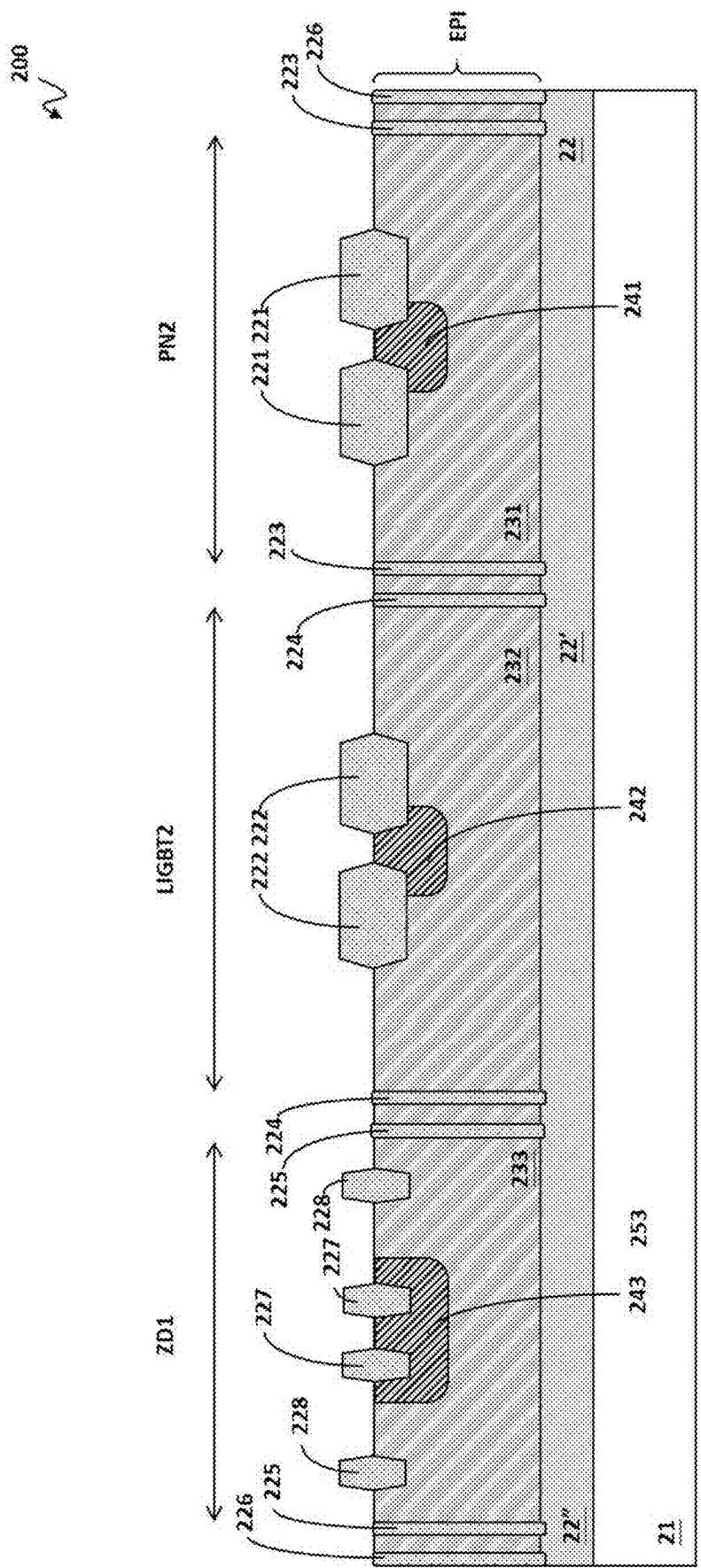

Next, as shown in FIG. 6D, the first field oxide region 221, the second field oxide region 222, the third field oxide region 227 and the fourth field oxide region 228 are formed. To be more specific, the first field oxide region 221, the second field oxide region 222, the third field oxide region 227 and the fourth field oxide region 228 can be simultaneously formed on and in contact with the upper surface of the above-mentioned N-type epitaxial layer via, for example but not limited to, a same oxidation process step. The first field oxide region 221, the second field oxide region 222, the third field oxide region 227 and the fourth field oxide region 228 are not limited to the local oxidation of silicon (LOCOS) structure as shown in FIG. 6D; for example, they may be shallow trench isolation (STI) structures instead. Please refer also to FIG. 2A. As shown in FIG. 2A, each of the first field oxide region 221, the second field oxide region 222, the third field oxide region 227 and the fourth field oxide region 228 has a closed surrounding configuration from top view; these closed surrounding configurations encompass a part of the first N-type extension region 241, a part of the second N-type extension region 242, a part of the third N-type extension region 243 and a part of the third N-type region 233, respectively.

Figure 6E:
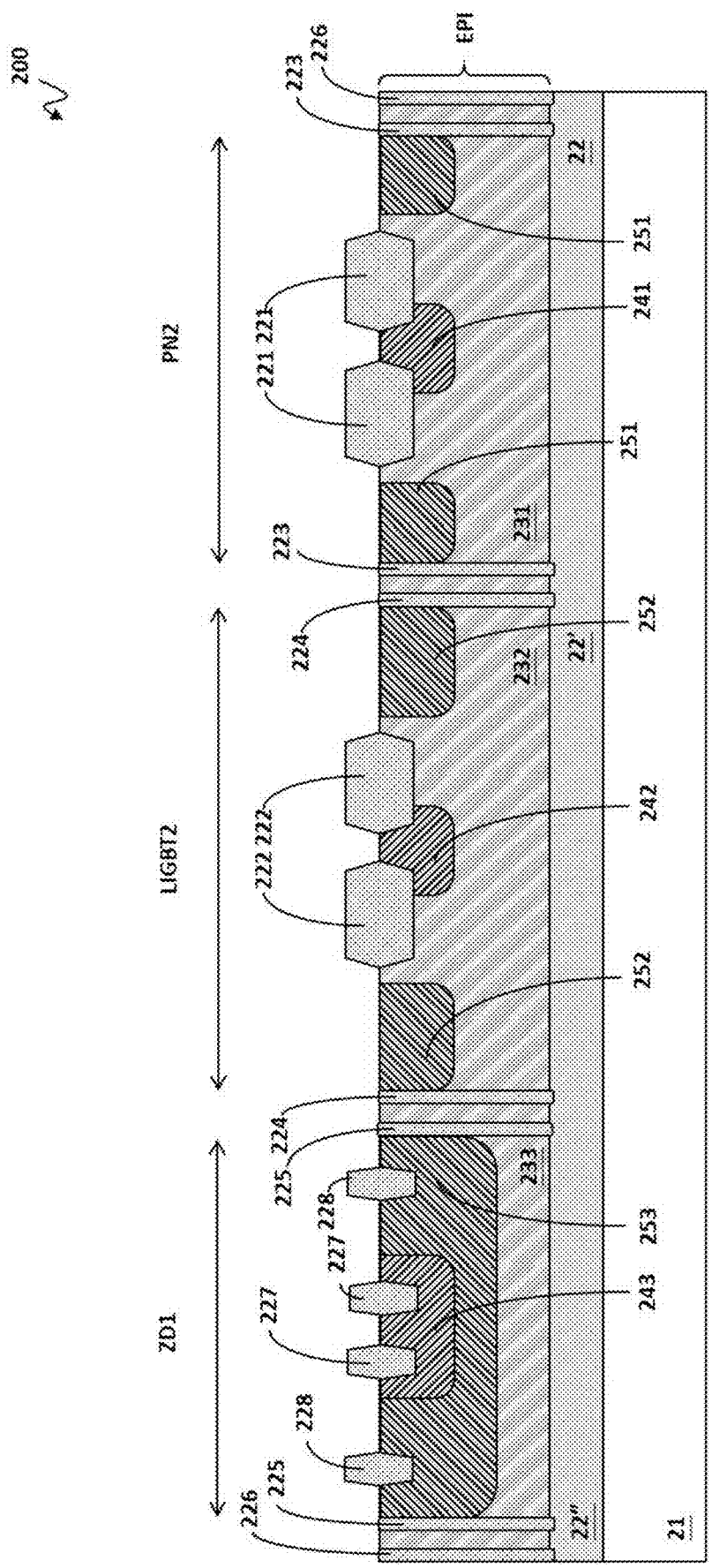

Next, as shown in FIG. 6E, the first P-type well 251, the second P-type well 252 and the third P-type well 253 are formed. To be more specific, the first P-type well 251 and the second P-type well 252 can be simultaneously defined via, for example but not limited to, a same lithography process step. Next, the first P-type well 251 and the second P-type well 252 can be simultaneously formed by, for example but not limited to, a same ion implantation process step which implants P-type impurities in the regions defined by the above-mentioned lithography process step in the form of accelerated ions, to form the first P-type well 251 and the second P-type well 252. The third P-type well 253 can be formed by for example a same lithography process step and a same ion implantation process step as the first P-type well 251 and the second P-type well 252 do. In other embodiments, aside from the first P-type well 251 and the second P-type well 252, the third P-type well 253 can be formed for example by a different lithography process step and a different ion implantation process step. The first P-type well 251, the second P-type well 252 and the third P-type well 253 have P conductivity type. The first P-type well 251, the second P-type well 252 and the third P-type well 253 are formed in the above-mentioned N-type epitaxial layer; the first P-type well 251, the second P-type well 252 and the third P-type well 253 are beneath and in contact with the upper surface of the N-type epitaxial layer. Please refer also to FIG. 2A. As shown in FIG. 2A, each of the first P-type well 251 and the second P-type well 252 has a closed surrounding configuration from top view; these closed surrounding configurations encompass a part of the first field oxide region 221 and a part of the second field oxide region 222, respectively.

Figure 6F:
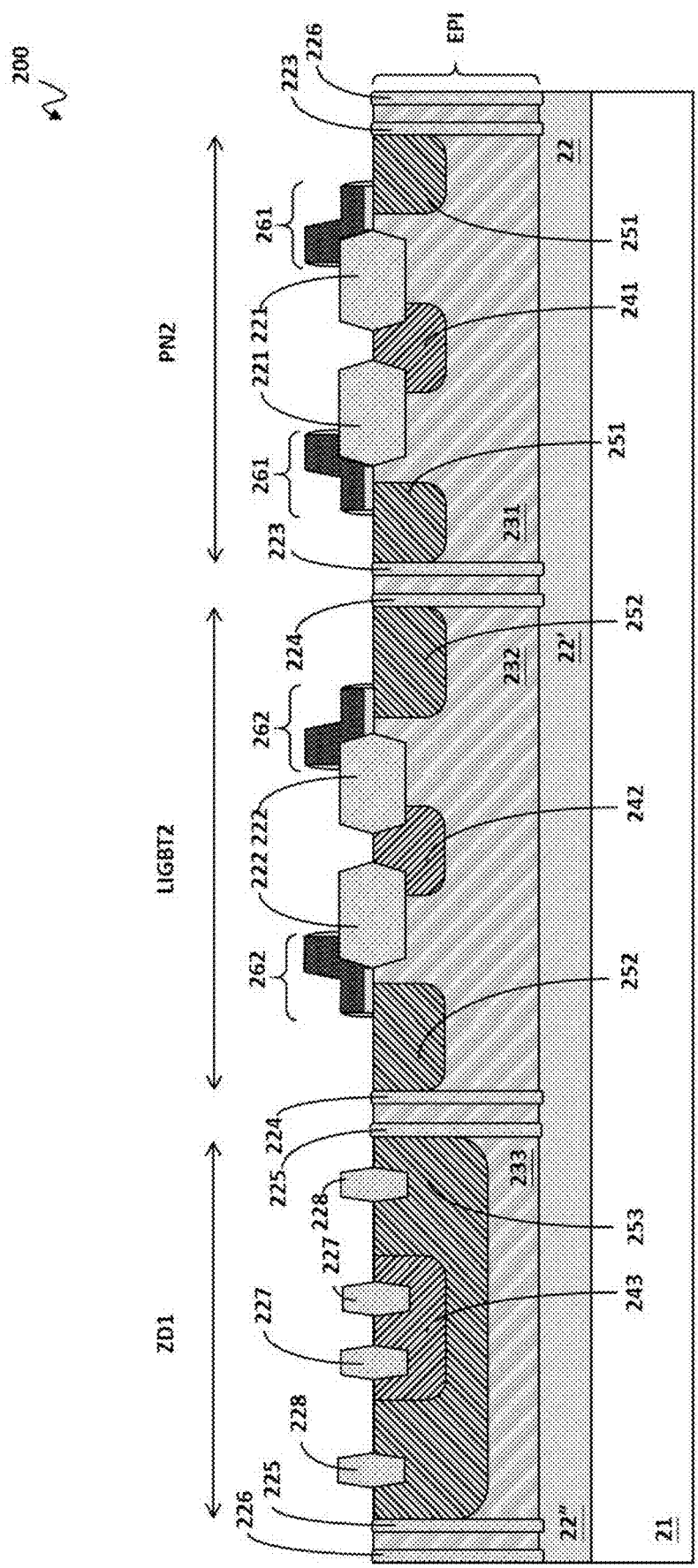

Next, as shown in FIG. 6F, the gate 261 and the gate 262 are formed. Please refer also to FIG. 2A. As shown in FIG. 2A, each of the gate 261 and the gate 262 has a closed surrounding configuration from top view of FIG. 2A. The gate 261 and the gate 262 can be simultaneously formed on the epitaxial layer via, for example but not limited to, a same gate formation process step. The gate 261 and the gate 262 include their own respective dielectric layers, conductive layers and spacer layers, which is well known to those skilled in the art, so the details thereof are not redundantly explained here. The above-mentioned gate formation process step for example comprises: a lithography process step and an oxidation process step for forming the dielectric layer; a lithography process step and a deposition process step for forming the conductive layer; and a deposition process step and an etching process step for forming the spacer layer.

Figure 6G:
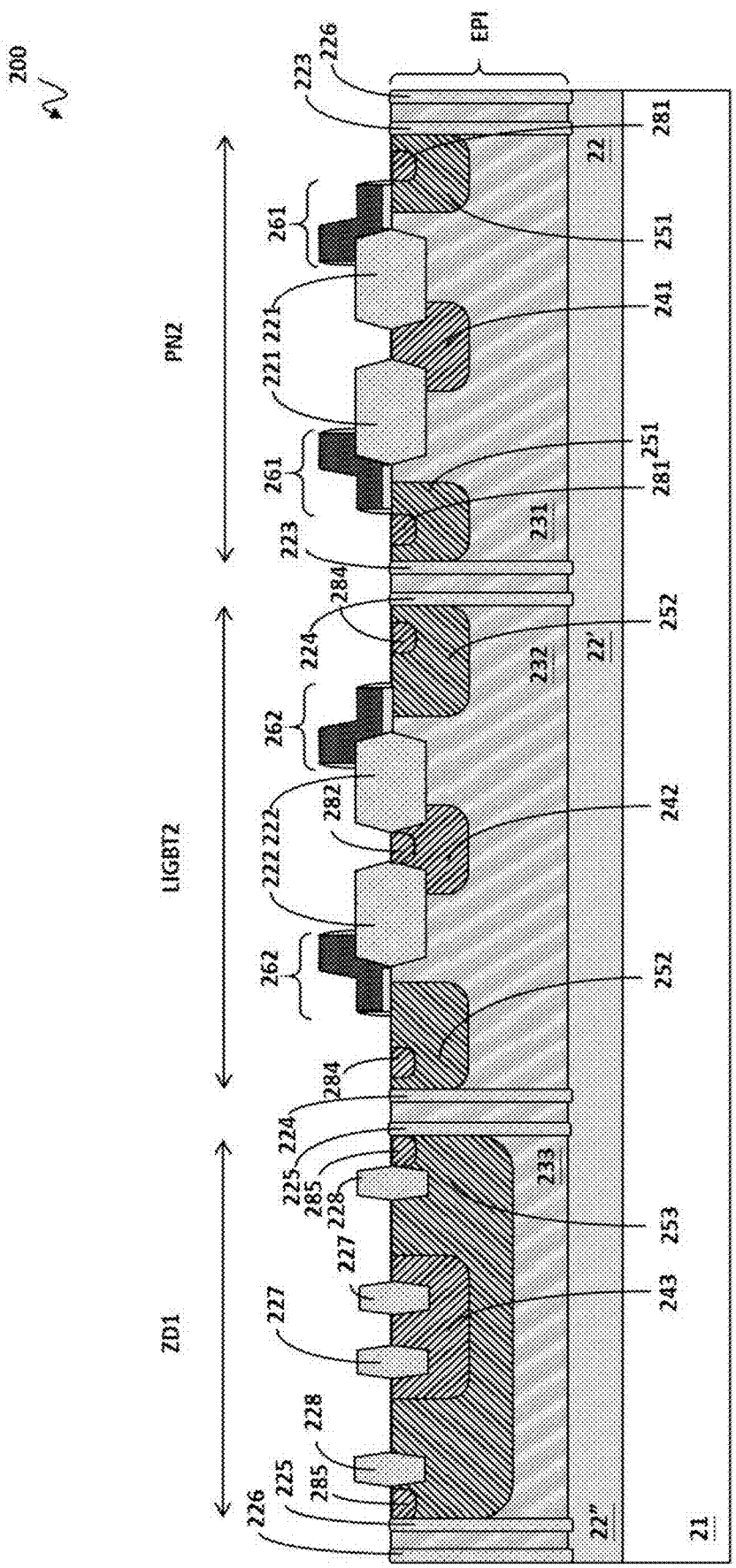

Next, as shown in FIG. 6G, the first forward terminal 281, the emitter 282, the P-type contact 284 and the second forward terminal 285 are formed. The first forward terminal 281, the emitter 282, the P-type contact 284 and the second forward terminal 285 can be simultaneously defined via, for example but not limited to, a same lithography process step. Next, the first forward terminal 281, the emitter 282, the P-type contact 284 and the second forward terminal 285 can be simultaneously formed by, for example but not limited to, a same ion implantation process step which implants P-type impurities in the regions defined by the above-mentioned lithography process step in the form of accelerated ions, to form the first forward terminal 281, the emitter 282, the P-type contact 284 and the second forward terminal 285. The first forward terminal 281, the emitter 282, the P-type contact 284 and the second forward terminal 285 have P conductivity type. The first forward terminal 281, the emitter 282, the P-type contact 284 and the second forward terminal 285 are formed in the first P-type well 251, the second N-type extension region 242, the second P-type well 252 and the third P-type well 253, respectively. The first forward terminal 281, the emitter 282, the P-type contact 284 and the second forward terminal 285 are beneath and in contact with the upper surface of the N-type epitaxial layer. Please refer also to the top view of FIG. 2A. As shown in FIG. 2A, each of first forward terminal 281, the P-type contact 284 and the second forward terminal 285 has a closed surrounding configuration from top view; these closed surrounding configurations the gate 261, the drain 272 and the fourth field oxide region 228, respectively.

Figure 6H:
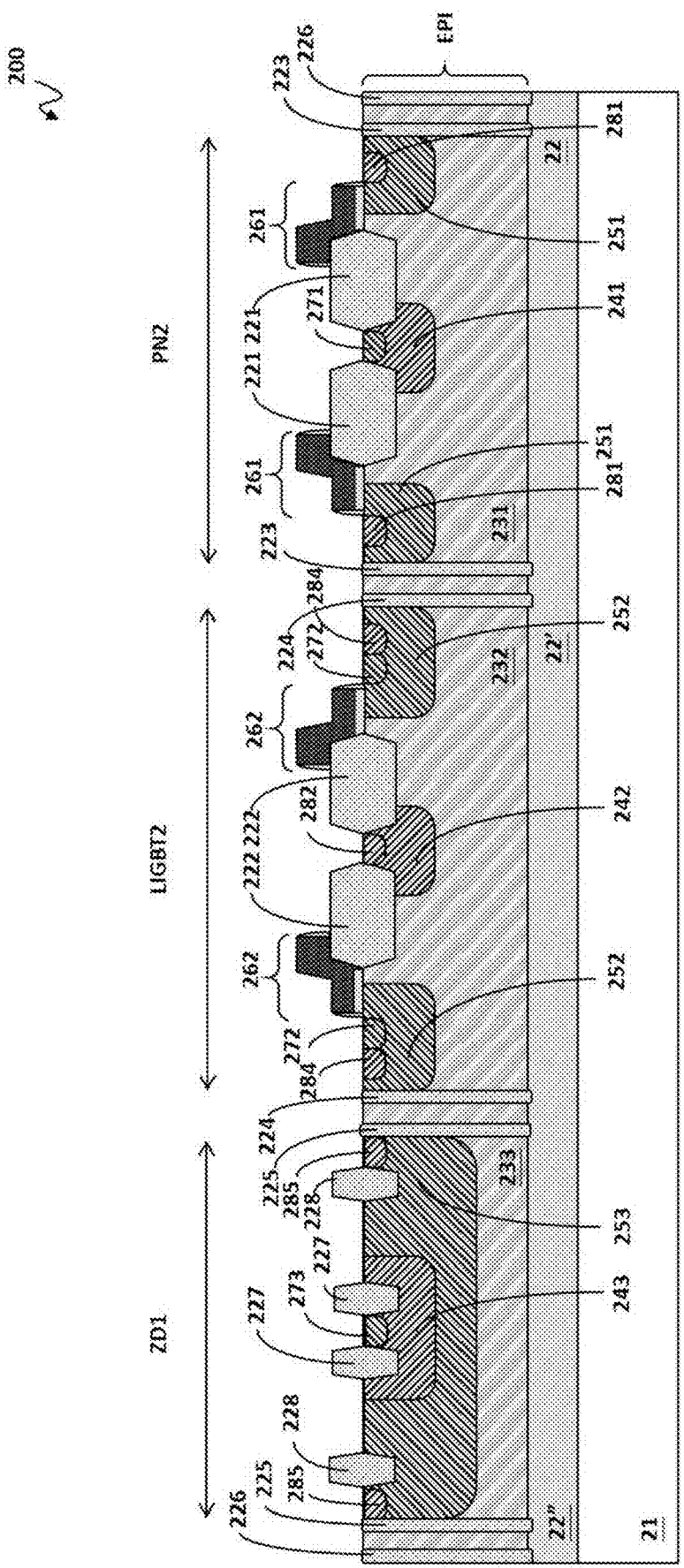

Next, as shown in FIG. 6H, the first reverse terminal 271, the drain 272 and the second reverse terminal 273 are formed. To be more specific, the first reverse terminal 271, the drain 272 and the second reverse terminal 273 can be simultaneously defined via, for example but not limited to, a same lithography process step (which includes adopting the gate 262 as a mask). Next, the first reverse terminal 271, the drain 272 and the second reverse terminal 273 can be simultaneously formed by, for example but not limited to, a same ion implantation process step which implants N-type impurities in the regions defined by the above-mentioned lithography process step in the form of accelerated ions, to form the first reverse terminal 271, the drain 272 and the second reverse terminal 273. The first reverse terminal 271, the drain 272 and the second reverse terminal 273 have N conductivity type. The first reverse terminal 271, the drain 272 and the second reverse terminal 273 are formed in the above-mentioned N-type epitaxial layer. The first reverse terminal 271, the drain 272 and the second reverse terminal 273 are beneath and in contact with the upper surface of the N-type epitaxial layer. Please refer also to the top view of FIG. 2A. As shown in FIG. 2A, the drain 272 has a closed surrounding configuration from top view, which encompasses the gate 262.

The present invention has been described in considerable detail with reference to certain preferred embodiments thereof. It should be understood that the description is for illustrative purpose, not for limiting the broadest scope of the present invention. Those skilled in this art can readily conceive variations and modifications within the spirit of the present invention. The various embodiments described above are not limited to being used alone; two embodiments may be used in combination, or a part of one embodiment may be used in another embodiment. For example, other process steps or structures, such as a deep well region, may be added. For another example, the lithography process step is not limited to the mask technology but it can also include electron beam lithography. Therefore, in the same spirit of the present invention, those skilled in the art can think of various equivalent variations and various combinations, and there are many combinations thereof, and the description will not be repeated here. The scope of the present invention should include what are defined in the claims and the equivalents.

What is claimed is:

1. A power device, which is formed on a semiconductor substrate and which is configured to operably drive a motor; the power device comprising:
   a lateral insulated gate bipolar transistor (LIGBT);
   a PN diode, which is connected in parallel to the LIGBT; and
   a clamp diode having a clamp forward terminal and a clamp reverse terminal, which are electrically connected to a drain and a gate of the LIGBT, respectively, to clamp a gate voltage applied to the gate not to be higher than a predetermined voltage threshold.

2. The power device of claim 1, wherein the PN diode includes:
   a first N-type region, which is formed in an epitaxial layer of the semiconductor substrate;
   a first P-type well, which is formed in the first N-type region;
   a first N-type extension region, which is formed in the first N-type region, wherein the first N-type extension region and the first P-type well are separated from each other by the first N-type region;
   a first reverse terminal having N conductivity type, wherein the first reverse terminal is formed in the first N-type extension region, wherein the first reverse terminal is configured to serve as an electric contact of the first N-type extension region; and
   a first forward terminal having P conductivity type, wherein the first forward terminal is formed in the first P-type well, wherein the first forward terminal is configured to serve as an electric contact of the first P-type well.

3. The power device of claim 2, wherein the LIGBT includes:
   a second N-type region, which is formed in the epitaxial layer of the semiconductor substrate;
   a second P-type well, which is formed in the second N-type region;
   the drain, which has N conductivity type, and is formed in the second P-type well;
   a P-type contact, which is formed in the second P-type well, wherein the P-type contact is configured to serve as an electric contact of the second P-type well;
   the gate, which is formed on the epitaxial layer, wherein apart of the gate is connected on the second P-type well;
   a second N-type extension region, which is formed in the second N-type region, wherein the second N-type extension region and the second P-type well are separated from each other by the second N-type region; and
   an emitter having P conductivity type, which is formed in the second N-type extension region.

4. The power device of claim 3, wherein the clamp diode is a Zener diode, which includes:
   a third P-type well, which is formed in the epitaxial layer of the semiconductor substrate;
   a second forward terminal having P conductivity type, wherein the second forward terminal is formed in the third P-type well, wherein the second forward terminal is configured to serve as the clamp forward terminal and an electric contact of the third P-type well;
   a third N-type extension region, which is formed in the third P-type well; and
   a second reverse terminal having N conductivity type, wherein the second reverse terminal is formed in the third N-type extension region, wherein the second reverse terminal is configured to serve as the clamp reverse terminal and an electric contact of the third N-type extension region.

5. The power device of claim 4, wherein the Zener diode further includes: an N-type adjustment region, which is formed beneath and in contact with an upper surface of the epitaxial layer, wherein the N-type adjustment region beneath the upper surface lies between the third P-type well and the third N-type extension region, to serve for adjusting a forward voltage of a PN junction formed between the third P-type well and the third N-type extension region.

6. The power device of claim 4, wherein the Zener diode further includes: a P-type adjustment region, which is formed beneath and in contact with an upper surface of the epitaxial layer, wherein the P-type adjustment region beneath the upper surface lies between the third P-type well and the third N-type extension region, to serve for adjusting a forward voltage of a PN junction formed between the third P-type well and the third N-type extension region.

7. The power device of claim 5, wherein the Zener diode further includes: an electrostatic discharge (ESD) protection region having N conductivity type, which is formed beneath and in contact with the upper surface of the epitaxial layer, wherein the ESD protection region beneath the upper surface lies between the third N-type extension region and the second forward terminal, wherein the ESD protection region, the third P-type well and the third N-type extension region together form an NPN transistor, wherein the ESD protection region is electrically connected to the second forward terminal.

8. The power device of claim 6, wherein the Zener diode further includes: an electrostatic discharge (ESD) protection region having N conductivity type, which is formed beneath and in contact with the upper surface of the epitaxial layer, wherein the ESD protection region beneath the upper surface lies between the third N-type extension region and the second forward terminal, wherein the ESD protection region, the third P-type well and the third N-type extension region together form an NPN transistor, wherein the ESD protection region is electrically connected to the second forward terminal.

9. The power device of claim 4, wherein the first N-type extension region, the second N-type extension region and the third N-type extension region are formed simultaneously by a same lithography process step and a same ion implantation process step;

wherein the first P-type well and the second P-type well are formed simultaneously by a same lithography process step and a same ion implantation process step;

wherein the first reverse terminal, the drain and the second reverse terminal are formed simultaneously by a same lithography process step and a same ion implantation process step; and wherein the first forward terminal, the emitter, the P-type contact and the second forward terminal are formed simultaneously by a same lithography process step and a same ion implantation process step.

10. A manufacturing method of a power device, wherein the power device is formed on a semiconductor substrate and is configured to operably drive a motor; the manufacturing method comprising:

forming a lateral insulated gate bipolar transistors (LIGBT);

forming a PN diode, which is connected in parallel to the LIGBT; and forming a clamp diode, wherein the clamp diode has a clamp forward terminal and a clamp reverse terminal, which are electrically connected to a drain and a gate of the LIGBT, respectively, to clamp a gate voltage applied to the gate not to be higher than a predetermined voltage threshold.

11. The manufacturing method of the power device of claim 10, wherein the step for forming the PN diode includes:

forming a first N-type region in an epitaxial layer of the semiconductor substrate;

forming a first P-type well in the first N-type region;

forming a first N-type extension region in the first N-type region, wherein the first N-type extension region and the first P-type well are separated from each other by the first N-type region;

forming a first reverse terminal having N conductivity type in the first N-type extension region, wherein the first reverse terminal is configured to serve as an electric contact of the first N-type extension region; and forming a first forward terminal having P conductivity type in the first P-type well, wherein the first forward terminal is configured to serve as an electric contact of the first P-type well.

12. The manufacturing method of the power device of claim 11, wherein the step for forming the LIGBT includes:

forming a second N-type region in the epitaxial layer of the semiconductor substrate;

forming a second P-type well in the second N-type region;

forming the drain, which has N conductivity type, in the second P-type well;

forming a P-type contact in the second P-type well, wherein the P-type contact is configured to serve as an electric contact of the second P-type well;

forming the gate on the epitaxial layer, wherein a part of the gate is connected on the second P-type well;

forming a second N-type extension region in the second N-type region, wherein the second N-type extension region and the second P-type well are separated from each other by the second N-type region; and forming an emitter having P conductivity type in the second N-type extension region.

13. The manufacturing method of the power device of claim 12, wherein the clamp diode is a Zener diode and the step for forming the clamp diode includes:

forming a third P-type well in the epitaxial layer of the semiconductor substrate;

forming a second forward terminal having P conductivity type in the third P-type well, wherein the second forward terminal is configured to serve as the clamp forward terminal and an electric contact of the third P-type well;

forming a third N-type extension region in the third P-type well; and forming a second reverse terminal having N conductivity type in the third N-type extension region, wherein the second reverse terminal is configured to serve as the clamp reverse terminal and an electric contact of the third N-type extension region.

14. The manufacturing method of the power device of claim 13, wherein the step for forming the clamp diode further includes:

forming an N-type adjustment region which is beneath and in contact with an upper surface of the epitaxial layer, wherein the N-type adjustment region beneath the upper surface lies between the third P-type well and the third N-type extension region, to serve for adjusting a forward voltage of a PN junction formed between the third P-type well and the third N-type extension region.

15. The manufacturing method of the power device of claim 13, wherein the step for forming the clamp diode further includes:

forming a P-type adjustment region which is beneath and in contact with an upper surface of the epitaxial layer, wherein the P-type adjustment region beneath the upper surface lies between the third P-type well and the third N-type extension region, to serve for adjusting a forward voltage of a PN junction formed between the third P-type well and the third N-type extension region.

16. The manufacturing method of the power device of claim 14, wherein the step for forming the clamp diode further includes:

forming an electrostatic discharge (ESD) protection region having N conductivity type beneath and in contact with the upper surface of the epitaxial layer, wherein the ESD protection region beneath the upper surface lies between the third N-type extension region and the second forward terminal, wherein the ESD protection region, the third P-type well and the third N-type extension region together form an NPN transistor, wherein the ESD protection region is electrically connected to the second forward terminal.

17. The manufacturing method of the power device of claim 15, wherein the step for forming the clamp diode further includes:

forming an electrostatic discharge (ESD) protection region having N conductivity type beneath and in contact with the upper surface of the epitaxial layer, wherein the ESD protection region beneath the upper surface lies between the third N-type extension region and the second forward terminal, wherein the ESD protection region, the third P-type well and the third N-type extension region together form an NPN transistor, wherein the ESD protection region is electrically connected to the second forward terminal.

18. The manufacturing method of the power device of claim 13, wherein the first N-type extension region, the second N-type extension region and the third N-type extension region are formed simultaneously by a same lithography process step and a same ion implantation process step;
   wherein the first P-type well and the second P-type well are formed simultaneously by a same lithography process step and a same ion implantation process step;
   wherein the first reverse terminal, the drain and the second reverse terminal are formed simultaneously by a same lithography process step and a same ion implantation process step; and
   wherein the first forward terminal, the emitter, the P-type contact and the second forward terminal are formed simultaneously by a same lithography process step and a same ion implantation process step.

* * * * *